United States Patent
Domon et al.

(10) Patent No.: US 9,944,738 B2
(45) Date of Patent: Apr. 17, 2018

(54) POLYMER COMPOUND, POSITIVE RESIST COMPOSITION, LAMINATE, AND RESIST PATTERNING PROCESS

(71) Applicant: SHIN-ETSU CHEMICAL CO., LTD., Tokyo (JP)

(72) Inventors: Daisuke Domon, Jyoetsu (JP); Satoshi Watanabe, Jyoetsu (JP); Keiichi Masunaga, Jyoetsu (JP); Masaaki Kotake, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/206,684

(22) Filed: Jul. 11, 2016

(65) Prior Publication Data

US 2017/0037167 A1 Feb. 9, 2017

(30) Foreign Application Priority Data

Aug. 5, 2015 (JP) ................. 2015-155422

(51) Int. Cl.
*C08F 216/10* (2006.01)
*G03F 1/78* (2012.01)
(Continued)

(52) U.S. Cl.
CPC .......... *C08F 216/10* (2013.01); *C08F 220/38* (2013.01); *G03F 1/78* (2013.01);
(Continued)

(58) Field of Classification Search
CPC .................................................... C08F 220/38
See application file for complete search history.

(56) References Cited

U.S. PATENT DOCUMENTS

2008/0085469 A1 4/2008 Ohsawa et al.
2008/0096128 A1 4/2008 Takeda et al.
(Continued)

FOREIGN PATENT DOCUMENTS

EP 2455811 A1 5/2012
JP 2004-115630 A 4/2004
(Continued)

OTHER PUBLICATIONS

Translation of Foreign priority document JP 2015-155343 filing dateAug. 5, 2016 from U.S. Appl. No. 15/195,395 published as US 2017/0038683 a1, 69 pages.*

(Continued)

*Primary Examiner* — Cynthia Hamilton

(74) *Attorney, Agent, or Firm* — Oliff PLC

(57) ABSTRACT

A polymer compound containing a repeating unit shown by the formula (1c) and one or more repeating units selected from a repeating unit shown by the formula (2) and a repeating unit shown by the formula (3),

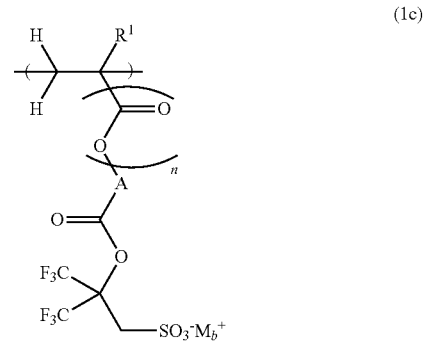

wherein $M_b^+$ represents a sulfonium cation shown by the formula (a) or an iodonium cation shown by the formula (b),

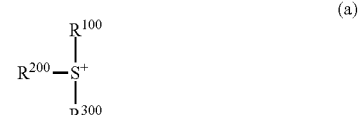

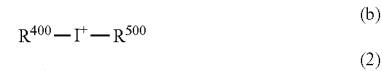

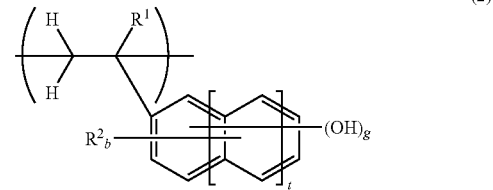

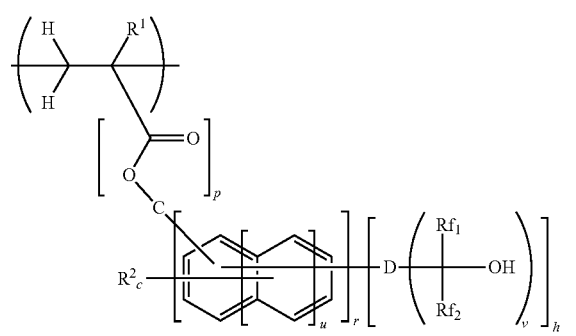

This polymer compound is suitable as a base resin of a resist composition capable of forming a resist film that allows pattern formation with extremely high resolution, small LER, and excellent rectangularity.

20 Claims, No Drawings

(51) Int. Cl.
| | |
|---|---|
| *G03F 7/039* | (2006.01) |
| *G03F 7/09* | (2006.01) |
| *G03F 7/20* | (2006.01) |
| *G03F 7/32* | (2006.01) |
| *C08F 220/38* | (2006.01) |

(52) U.S. Cl.
CPC ............ *G03F 7/039* (2013.01); *G03F 7/0397* (2013.01); *G03F 7/093* (2013.01); *G03F 7/2059* (2013.01); *G03F 7/322* (2013.01)

(56) References Cited

U.S. PATENT DOCUMENTS

| | | | |
|---|---|---|---|
| 2008/0102407 | A1 | 5/2008 | Ohsawa et al. |
| 2008/0118860 | A1 | 5/2008 | Harada et al. |
| 2008/0305411 | A1 | 12/2008 | Koitabashi et al. |
| 2010/0209827 | A1 | 8/2010 | Ohashi et al. |
| 2010/0316955 | A1 | 12/2010 | Masunaga et al. |
| 2010/0324329 | A1 | 12/2010 | Nagai et al. |
| 2011/0171577 | A1 | 7/2011 | Tsuchimura et al. |
| 2012/0308932 | A1* | 12/2012 | Sagehashi ............ G03F 7/0045 430/285.1 |
| 2013/0101936 | A1* | 4/2013 | Taniguchi ............ G03F 7/0045 430/280.1 |
| 2014/0199629 | A1 | 7/2014 | Ohashi et al. |
| 2014/0272707 | A1 | 9/2014 | Fukushima et al. |
| 2017/0038683 | A1* | 2/2017 | Ohashi .................... G03F 7/039 |

FOREIGN PATENT DOCUMENTS

| | | | |
|---|---|---|---|
| JP | 3790649 | B2 | 6/2006 |
| JP | 2007-328060 | A * | 12/2007 |
| JP | 2008-102383 | A | 5/2008 |
| JP | 2008-111103 | A | 5/2008 |
| JP | 2008-304590 | A | 12/2008 |
| JP | 2009-053518 | A | 3/2009 |
| JP | 2010-100604 | A | 5/2010 |
| JP | 2010-215608 | A | 9/2010 |
| JP | 2011-022564 | A | 2/2011 |
| JP | 4893580 | B2 | 3/2012 |
| JP | 5083528 | B2 | 11/2012 |
| JP | 2014-177407 | A | 9/2014 |
| WO | 2006/121096 | A1 | 11/2006 |

OTHER PUBLICATIONS

Foreign priority document JP 2015-155343 filing dateAug. 5, 2016 from U.S. Appl. No. 15/195,395 published as US 2017/0038683 a1, 58 pages.*

English translation of JP, 2007-328060, A (2007) from machine translation from AIPN Japan Patent Office National Center for Industrial Property Information and Training, generated Mar. 31, 2017, 50 pages.*

Oct. 11, 2016 Extended European Search Report issued in Patent Application No. 16001726.5.

Bozano, Luisa d., et al., "Conductive Layer for Charge Dissipation During Electron-Beam Xposures." Proc. of SPIE vol. 8522 85220O-1, (2012).

* cited by examiner

POLYMER COMPOUND, POSITIVE RESIST COMPOSITION, LAMINATE, AND RESIST PATTERNING PROCESS

BACKGROUND OF THE INVENTION

Field of the Invention

The present invention relates to a polymer compound containing a repeating unit sensitive to a high energy beam, a positive resist composition containing the polymer compound, a laminate containing a resist film formed from the positive resist composition, and a resist patterning process using the positive resist composition.

Description of the Related Art

A finer pattern rule has been recently required for integrated circuits with higher integration. To process a pattern with a size of 0.2 µm or less, a chemically amplified resist composition, which uses an acid as a catalyst, has been mainly used. In this process, high energy beams such as ultraviolet ray, far ultraviolet ray, extreme ultraviolet ray (EUV), and electron beam (ER) are used as an exposure light source. Especially, the electron beam lithography, which is employed as ultrafine processing technique, is also indispensable for processing a photomask blank in producing a photomask for semiconductor manufacture.

A resist composition used in such a photolithography can be classified into a positive type, in which an exposed part dissolves to form a pattern, and a negative type, in which an exposed part remains to form a pattern. These compositions are appropriately selected according to the form of the resist pattern to be required.

In general, the electron beam lithography uses an electron beam. In the case of positive resist, the resist film is sequentially irradiated with an electron beam having a fine surface area except for a region to be left, without using a mask. In the case of negative resist, the region to be left of the resist film is sequentially irradiated. Consequently, this method needs to sweep across the finely divided region on the surface to be processed and thus takes more time than one-time exposure using a photomask. To keep the throughput high, this method requires a sensitive resist film. In the photomask blank processing, which is particularly important use, some photomask substrates are coated with a surface material that easily affects pattern profile of the chemically amplified resist film, like a chromium compound film such as chromium oxide film. To keep high resolution and profile after etching, it is important to keep the pattern profile of the resist film rectangular, regardless of the type of the substrate. Moreover, it is also important that line edge roughness (LER) is small.

Incidentally, control of the resist sensitivity and the pattern profile has been improved by various methods, for example, by selecting or combining materials used for the resist composition and process conditions. One of the improvement methods is to reduce acid diffusion, which significantly affects resolution of the chemically amplified resist film. The photomask processing requires that the profile of the obtained resist pattern is not changed depending on the time between exposure and baking. This time-dependent change is mostly caused by diffusion of an acid generated by exposure. The acid diffusion significantly affects, not only the photomask processing, but also sensitivity and resolution of a usual resist composition. Thus, many studies have been made on this problem.

Patent Document 1 and Patent Document 2 disclose examples of controlling the acid diffusion by using a bulky acid generated from an acid generator to reduce LER. However, this acid generator is still insufficient for controlling the acid diffusion. Thus, it is desired to develop an acid generator that can more greatly reduce the diffusion.

Patent Document 3 discloses an example of controlling the acid diffusion by incorporating a repeating unit having a sulfonium structure that generates a sulfonic acid by exposure into a resin used in the resist composition. Such a method of incorporating a repeating unit that generates an acid by exposure into the base resin is effective in obtaining a pattern with small LER. However, the base resin incorporated with the repeating unit that generates an acid by exposure can have a problem of solubility in an organic solvent, depending on the structure and the introducing ratio.

Besides, polymers having many aromatic skeletons with acidic side chains, such as polyhydroxystyrene, have been favorably used for a resist composition for KrF excimer laser, but not for ArF excimer laser because they have large absorption of light about 200 nm wavelength. However, these polymers are important to the resist compositions for electron beam and for EUV, which are effective in forming a finer pattern than a processing limit of the ArF excimer laser, in that the polymers have high etching resistance.

A base resin mainly used in the positive resist composition for electron beam or EUV contains an acid-labile protective group that masks an acidic functional group of a phenolic side chain. This protective group deprotects by an acid catalyst generated from a photo acid generator by irradiation with a high energy beam, thereby causing the base resin to be solubilized in an alkaline developer. As the acid-labile protective group, a tertiary alkyl group, a tert-butoxycarbonyl group, an acetal group, and the like have been mainly used. The use of a protective group that requires a relatively low activation energy for deprotection, such as the acetal group, can advantageously provide a sensitive resist film. However, if the diffusion of generated acids is insufficiently controlled, deprotection reaction takes place even in an unexposed part of the resist film, thereby causing problems of lowering LER and decreasing in-plane uniformity of the pattern line width (CDU, Critical Dimension Uniformity).

In addition, Patent Document 4, which discloses a resist composition containing a sulfonium salt capable of generating a strong acid such as a fluorinated alkanesulfonic acid and a resin having a repeating unit containing an acetal group, has a problem of forming a pattern with large LER. Patent Document 5, which discloses incorporating a fluorinated alkanesulfonic acid into the resin to reduce the acid diffusion, also fails to solve the same problem.

This pattern with large LER is supposed to be caused by too strong acidity of the fluorinated alkanesulfonic acid relative to deprotection of the acetal group, which requires a relatively low activation energy for deprotection. In other words, a trace of acids diffused into the unexposed part advances the deprotection reaction even if the acid diffusion is controlled. The same problem arises in the case of using a protective group that requires higher activation energy than the acetal group, such as a tertiary alkyl group and a tert-butoxycarbonyl group. Thus it is desired to solve this problem.

PRIOR ART DOCUMENTS

Patent Documents

Patent Document 1: Japanese Patent Laid-Open Publication No. 2009-053518

Patent Document 2: Japanese Patent Laid-Open Publication No. 2010-100604
Patent Document 3: Japanese Patent Laid-Open Publication No. 2011-22564
Patent Document 4: Japanese Patent No. 5083528
Patent Document 5: Japanese Patent No. 4893580

SUMMARY OF THE INVENTION

The present invention has been done to solve the above problems, and an object thereof is to provide a polymer compound suitable as a base resin of a positive resist composition capable of forming a resist film that allows pattern formation with extremely high resolution, small LER, and excellent rectangularity; a positive resist composition using the polymer compound; a laminate having a resist film formed from the positive resist composition; and a resist patterning process using the positive resist composition.

To accomplish the above object, the present invention provides a polymer compound comprising a repeating unit shown by the formula (1c) and one or more repeating units selected from a repeating unit shown by the formula (2) and a repeating unit shown by the formula (3),

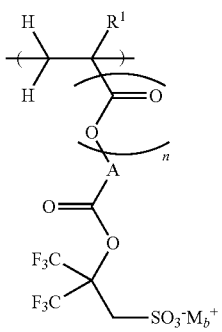

(1c)

wherein $R^1$ represents a hydrogen atom, a fluorine atom, a methyl group, or a trifluoromethyl group; A represents a single bond or a linear divalent hydrocarbon group having 1 to 30 carbon atoms or a branched or cyclic divalent hydrocarbon group having 3 to 30 carbon atoms, in which the hydrocarbon group may contain a heteroatom, and a part or all of hydrogen atoms in the hydrocarbon group may be substituted with a group containing a heteroatom; "n" represents 0 or 1, provided that "n" is 0 when A is a single bond; and $M_b^+$ represents a sulfonium cation shown by the formula (a) or an iodonium cation shown by the formula (b),

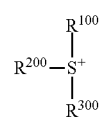

(a)

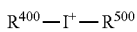

(b)

wherein $R^{100}$, $R^{200}$, $R^{300}$, $R^{400}$, and $R^{500}$ independently represent a heteroatom or a linear monovalent hydrocarbon group having 1 to 20 carbon atoms or a branched or cyclic monovalent hydrocarbon group having 3 to 20 carbon atoms, in which the hydrocarbon group may contain a heteroatom, and a part or all of hydrogen atoms in the hydrocarbon group may be substituted with a group containing a heteroatom; and two or more of $R^{100}$, $R^{200}$, and $R^{300}$ may be bonded to each other to form a ring together with the sulfur atom in the formula,

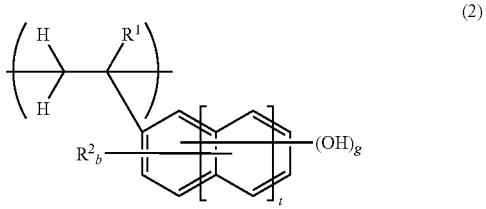

(2)

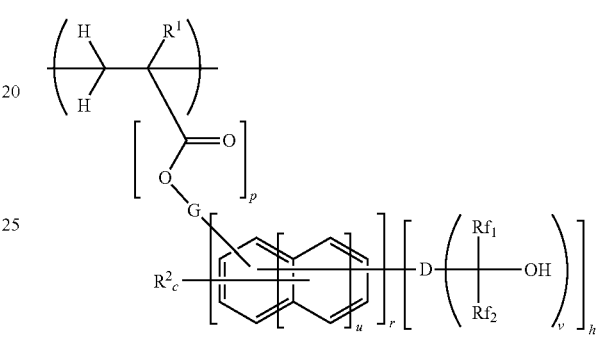

(3)

wherein G represents a single bond or an alkylene group having 1 to 10 carbon atoms and optionally containing an ether oxygen atom; D represents a single bond, or a linear aliphatic hydrocarbon group having 1 to 10 carbon atoms or a branched or cyclic aliphatic hydrocarbon group having 3 to 10 carbon atoms with a valency of v+1, in which the aliphatic hydrocarbon group may contain an ether oxygen atom, a carbonyl group, or a carbonyloxy group, and a part or all of hydrogen atoms in the aliphatic hydrocarbon may be substituted with a fluorine atom; $R^1$ is as defined above; $R^2$ represents a hydrogen atom, a halogen atom, a linear acyloxy group having 2 to 8 carbon atoms, a branched or cyclic acyloxy group having 3 to 8 carbon atoms, a linear alkyl group having 1 to 6 carbon atoms, a branched or cyclic alkyl group having 3 to 6 carbon atoms, a linear alkoxy group having 1 to 6 carbon atoms, or a branched or cyclic alkoxy group having 3 to 6 carbon atoms, in which a part or all of hydrogen atoms in the acyloxy group, the alkyl group, and the alkoxy group may be substituted with halogen; $Rf_1$ and $Rf_2$ each represent an alkyl group having 1 to 6 carbon atoms and containing at least one fluorine atom, and $Rf_1$ may bond to D to form a ring together with the carbon atom to which these groups are bonded; "g" represents an integer of 0 to 3; "h" and "v" each represent 1 or 2; "p" and "r" each represent 0 or 1, provided that "p" is 1 and G is a single bond when "r" is 0; "t" and "u" each represent an integer of 0 to 2; "b" represents an integer of (5+2t−g); and "c" represents an integer of (5+2u−h).

Such a polymer compound is suitable as a base resin of a resist composition capable of forming a resist film that allows pattern formation with extremely high resolution, small LER, and excellent rectangularity.

The polymer compound preferably further comprises one or more repeating units selected from a repeating unit shown by the formula (4) and a repeating unit shown by the formula (5),

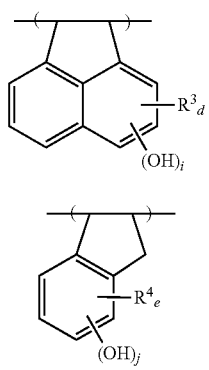

(4)

(5)

wherein $R^3$ and $R^4$ each represent a hydrogen atom, a halogen atom, a linear acyloxy group having 2 to 8 carbon atoms, a branched or cyclic acyloxy group having 3 to 8 carbon atoms, a linear alkyl group having 1 to 6 carbon atoms, a branched or cyclic alkyl group having 3 to 6 carbon atoms, a linear alkoxy group having 1 to 6 carbon atoms, or a branched or cyclic alkoxy group having 3 to 6 carbon atoms, in which a part or all of hydrogen atoms in the acyloxy group, the alkyl group, and the alkoxy group may be substituted with halogen; "i" and "j" represent an integer of 0 to 3; "d" represents an integer of 0 to 5; and "e" represents an integer of 0 to 3.

A resist composition using such a polymer compound as a base resin can form a resist film having high resistance to electron beam irradiation.

The polymer compound preferably further comprises a repeating unit shown by the formula (U-2),

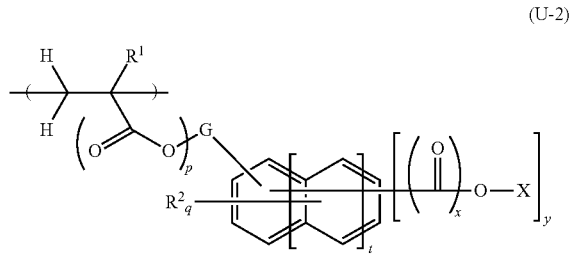

(U-2)

wherein $R^1$, $R^2$, G, "p", and "t" are as defined above; "x" represents 0 or 1; "y" represents an integer of 1 to 3; "q" represents an integer of (5+2t−y); X represents a hydrogen atom or an acid-labile group, provided that at least one X is an acid-labile group.

A resist composition using such a polymer compound as a base resin can form a resist film in which an exposed part is soluble in an alkali aqueous solution.

Furthermore, the present invention provides a positive resist composition comprising the above polymer compound.

Such a positive resist composition can form a resist film that provides a pattern with extremely high resolution, small LER, and excellent rectangularity.

The positive resist composition preferably further comprises a compound capable of generating an acid by irradiation with a high energy beam.

This compound allows adjustment of sensitivity and resolution of the resist film formed from the positive resist composition.

The positive resist composition preferably further comprises a polymer compound that contains a repeating units shown by the formula (6) and a repeating unit containing at least one fluorine atom,

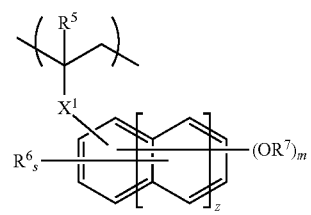

(6)

wherein $R^5$ represents a hydrogen atom or a methyl group; $R^6$ and R' represent a hydrogen atom or a linear, branched, or cyclic hydrocarbon group having 1 to 5 carbon atoms and optionally containing a heteroatom; $X^1$ represents a single bond, —O(—O)O—, or —C(—O)NH—; "z" represents 0 or 1; "m" represents an integer of 1 to 3; and "s" represents an integer of (5+2z−m).

When such a positive resist composition is used to form a resist film, the resist film can be successfully coated with an antistatic film.

Furthermore, the present invention provides a laminate comprising a resist film formed from the above positive resist composition on a photomask blank.

Such a laminate can be successfully coated with an antistatic film.

The laminate preferably further comprises an antistatic film on the resist film.

Such a laminate can prevent the pattern drawing accuracy from decreasing.

Furthermore, the present invention provides a resist patterning process comprising the step of: forming a resist film on a substrate to be processed from the above positive resist composition; exposing the formed resist film to a high energy beam by pattern irradiation; developing the exposed resist film with an alkaline developer to form a resist pattern.

Such a resist patterning process can form a pattern with extremely high resolution, small LER, and excellent rectangularity.

The high energy beam is preferably an EUV or an electron beam.

The above high energy beam can be suitably used in the inventive resist patterning process.

The substrate to be processed is preferably a photomask blank.

This allows production of a photomask having a pattern with extremely high resolution, small LER, and excellent rectangularity.

An outermost surface of the photomask blank is preferably formed of a chromium material.

Thus, the inventive resist patterning process can use a chromium material on the outermost surface of the photomask blank.

As mentioned above, the inventive polymer compound is suited to a base resin of a chemically amplified resist composition, and this composition can form a resist film that allows pattern formation with extremely high resolution, small LER, and good pattern profile after exposure and is sensitive to high energy beams such as ultraviolet ray, far ultraviolet ray, electron beam, EUV, X-ray, γ-ray, and synchrotron radiation beam, which are used for processing semiconductors or photomask blanks. In addition, the inventive positive resist composition can be used in an exposure step of radiating a high energy beam, thereby forming a resist film with high resolution, small LER, and good pattern profile after exposure. In addition, the inventive laminate can be successfully coated with an antistatic film. In addition, the inventive resist patterning process can form a pattern with extremely high resolution, small LER, and excellent rectangularity.

DETAILED DESCRIPTION OF THE PREFERRED EMBODIMENTS

As mentioned above, it is desired to develop a resist composition capable of forming a resist film that allows pattern formation with extremely high resolution, small LER, and excellent rectangularity. To accomplish the object, the present inventors have studied on an acid-generating unit having an appropriate acidity to deprotect phenol side chains protected by acid-labile groups. Consequently, they have introduced, into a chemically amplified positive resist composition, a resin containing both an acid-generating repeating unit having a specific structure and a repeating unit whose phenolic side chain is protected by an acid-labile group, and found that this positive resist composition can form a resist film that allows pattern formation with higher resolution, smaller LER, and better pattern profile after exposure than the conventional positive resist composition, thereby brining the present invention to completion.

That is, the present invention is a polymer compound comprising a repeating unit shown by the formula (1c) and one or more repeating units selected from a repeating unit shown by the formula (2) and a repeating unit shown by the formula (3),

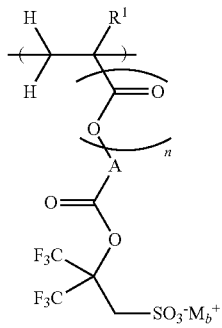

(1c)

wherein $R^1$ represents a hydrogen atom, a fluorine atom, a methyl group, or a trifluoromethyl group; A represents a single bond or a linear divalent hydrocarbon group having 1 to 30 carbon atoms or a branched or cyclic divalent hydrocarbon group having 3 to 30 carbon atoms, in which the hydrocarbon group may contain a heteroatom, and a part or all of hydrogen atoms in the hydrocarbon group may be substituted with a group containing a heteroatom; "n" represents 0 or 1, provided that "n" is 0 when A is a single bond; and $M_b^+$ represents a sulfonium cation shown by the formula (a) or an iodonium cation shown by the formula (b),

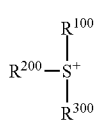

(a)

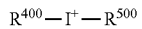

(b)

wherein $R^{100}$, $R^{200}$, $R^{300}$, $R^{400}$, and $R^{500}$ independently represent a heteroatom or a linear monovalent hydrocarbon group having 1 to 20 carbon atoms or a branched or cyclic monovalent hydrocarbon group having 3 to 20 carbon atoms, in which the hydrocarbon group may contain a heteroatom, and a part or all of hydrogen atoms in the hydrocarbon group may be substituted with a group containing a heteroatom; and two or more of $R^{100}$, $R^{200}$, and $R^{300}$ may be bonded to each other to form a ring together with the sulfur atom in the formula,

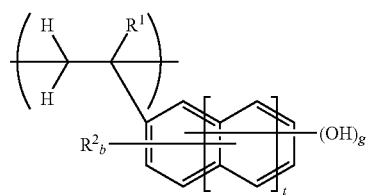

(2)

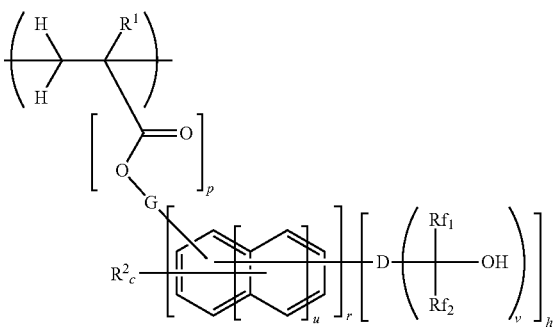

(3)

wherein G represents a single bond or an alkylene group having 1 to 10 carbon atoms and optionally containing an ether oxygen atom; D represents a single bond, or a linear aliphatic hydrocarbon group having 1 to 10 carbon atoms or a branched or cyclic aliphatic hydrocarbon group having 3 to 10 carbon atoms with a valency of v+1, in which the aliphatic hydrocarbon group may contain an ether oxygen atom, a carbonyl group, or a carbonyloxy group, and a part or all of hydrogen atoms in the aliphatic hydrocarbon may be substituted with a fluorine atom; $R^1$ is as defined above; $R^2$ represents a hydrogen atom, a halogen atom, a linear acyloxy group having 2 to 8 carbon atoms, a branched or cyclic acyloxy group having 3 to 8 carbon atoms, a linear alkyl group having 1 to 6 carbon atoms, a branched or cyclic alkyl group having 3 to 6 carbon atoms, a linear alkoxy group having 1 to 6 carbon atoms, or a branched or cyclic alkoxy group having 3 to 6 carbon atoms, in which a part or all of hydrogen atoms in the acyloxy group, the alkyl group, and the alkoxy group may be substituted with halogen; $Rf_1$ and $Rf_2$ each represent an alkyl group having 1 to 6 carbon atoms and containing at least one fluorine atom, and $Rf_1$ may bond to D to form a ring together with the carbon atom to which these groups are bonded; "g" represents an integer of 0 to 3; "h" and "v" each represent 1 or 2; "p" and "r" each represent 0 or 1, provided that "p" is 1 and G is a single bond when "r" is 0; "t" and "u" each represent an integer of 0 to 2; "b" represents an integer of (5+2t−g); and "c" represents an integer of (5+2u−h).

Hereinafter, the present invention will be described in detail, but the present invention is not limited thereto. In the following description, some structures shown by chemical formulae contain an asymmetric carbon, thus including an enantiomer and a diastereomer. In this case, these isomers are collectively shown by one formula. These isomers may be used alone or in combination.

<Polymer Compound>

The present invention provides a polymer compound containing a repeating unit shown by the formula (1c) and one or more repeating units selected from a repeating unit shown by the formula (2) and a repeating unit shown by the formula (3).

The repeating unit shown by the formula (1c) generates an acid in which the β-position of the sulfonyl group is difluoromethylated, when irradiated with a high energy beam such as ultraviolet ray, far ultraviolet ray, electron beam, EUV, X-ray, γ-ray, and synchrotron radiation beam. This acid has an appropriate acidity to deprotect a polymer containing units in which a phenolic hydroxyl group is protected by an acetal group, a tertiary alkyl group, a tert-butoxycarbonyl group or the like. In addition, when the polymer compound containing this repeating unit is used as a base resin of a resist composition, movement and diffusion of the generated acids can be appropriately controlled.

A photo acid generator that generates an arenesulfonic acid by irradiation with a high energy beam is also commonly used to deprotect the resin containing units protected by an acetal group, a tertiary alkyl group, or a tert-butoxycarbonyl group. However, when the arenesulfonic acid-generating unit is introduced as a repeating unit of the base resin to achieve the same effect as the present invention, the base resin fails to dissolve in a resist solvent due to its low solvent-solubility in some cases. By contrast, the inventive resin containing the unit shown by the formula (1c) has sufficient lipid-solubility and thus is easily produced, handled, and used to prepare a resist composition.

In the formula (1c), A represents a single bond or a linear divalent hydrocarbon group having 1 to 30 carbon atoms or a branched or cyclic divalent hydrocarbon group having 3 to 30 carbon atoms, in which the hydrocarbon group may contain a heteroatom, and a part or all of hydrogen atoms in the hydrocarbon group may be substituted with a group containing a heteroatom. Illustrative examples thereof include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. In addition, a part of hydrogen atoms in these groups may be substituted with an alkyl group such as a methyl group, an ethyl group, a propyl group, a n-butyl group, and a tert-butyl group. Also, these groups may contain a heteroatom such as an oxygen atom, a sulfur atom, a nitrogen atom, and a halogen atom, and a part or all of hydrogen atoms in the groups may be substituted with a group containing a heteroatom such as an oxygen atom, a sulfur atom, a nitrogen atom, and a halogen atom so as to form a hydroxyl group, a cyano group, a carbonyl group, an ether bond, an ester bond, a sulfonate ester bond, a carbonate bond, a lactone ring, a sultone ring, a carboxylic anhydride, a haloalkyl group or the like. In view of availability of raw materials, unsubstituted alkylene groups, a phenylene group, and a naphthylene group are preferable.

A method for synthesizing a salt usable as a raw material of the repeating unit shown by the formula (1c) is described below. While the method presented herein will be discussed in connection with sulfonium cation, the present invention is not limited thereto.

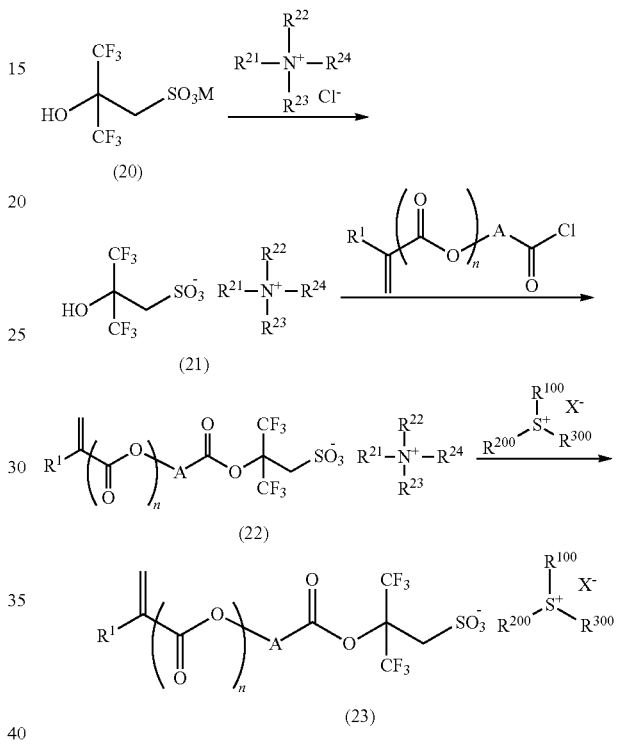

wherein M represents a cation; $R^{21}$, $R^{22}$, $R^{23}$ and $R^{24}$ represent a monovalent organic group; $R^1$, "n", A, $R^{100}$, $R^{200}$, and $R^{330}$ are as defined above; and $X^-$ represents a halide ion or a methylsulfate ion.

First, a sulfonate shown by the formula (20) is synthesized with referring to Japanese Patent Laid-Open Publication No. 2010-215608. Then, the cation of the obtained sulfonate is exchanged for ammonium cation by ion-exchange to form an ammonium sulfonate shown by the formula (21). This ion-exchange may use an organic solvent such as dichloromethane, ethyl acetate, methyl isobutyl ketone, methanol, ethanol, and acetonitrile alone, or together with water. For example, a mixture with a benzyltrimethylammonium chloride aqueous solution may be used.

Then, the obtained ammonium sulfonate is brought to react with an acylating agent to synthesize an acylated ammonium sulfonate shown by the formula (22). This reaction easily progresses by a known method. For example, there may be mentioned a method in which the ammonium sulfonate shown by the formula (21), the acylating agent, and a base such as triethylamine, pyridine, and 4-dimethylaminopyridine are mixed sequentially or simultaneously without solvent or in a solvent such as methylene chloride, toluene, hexane, diethyl ether, tetrahydrofuran, and acetonitrile, under heating or cooling as needed, to perform the reaction.

Further, a sulfonate shown by the formula (23) is synthesized from the acylated ammonium sulfonate shown by the formula (22). For example, the reaction may be performed by mixing with an organic solvent such as dichloromethane, ethyl acetate, methyl isobutyl ketone, methanol, ethanol, and acetonitrile alone or a combination thereof with water, such as a triphenylsulfonium chloride aqueous solution.

Preferable examples of the anion structure of the sulfonium salt that can be used as the raw material of the repeating unit shown by the formula (1c) are shown below, although not limited thereto.

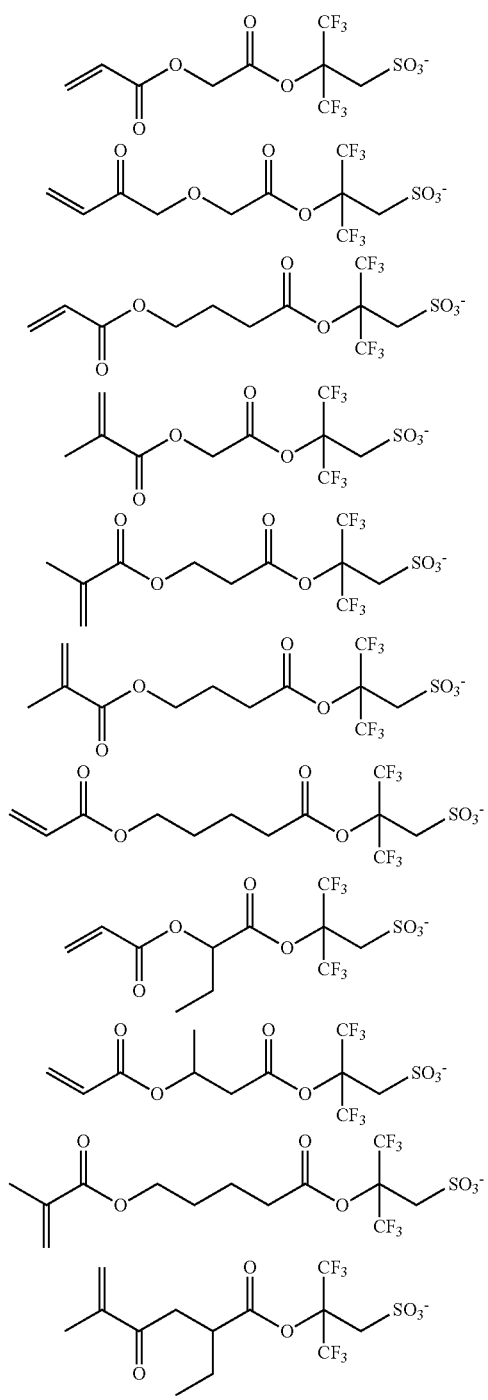

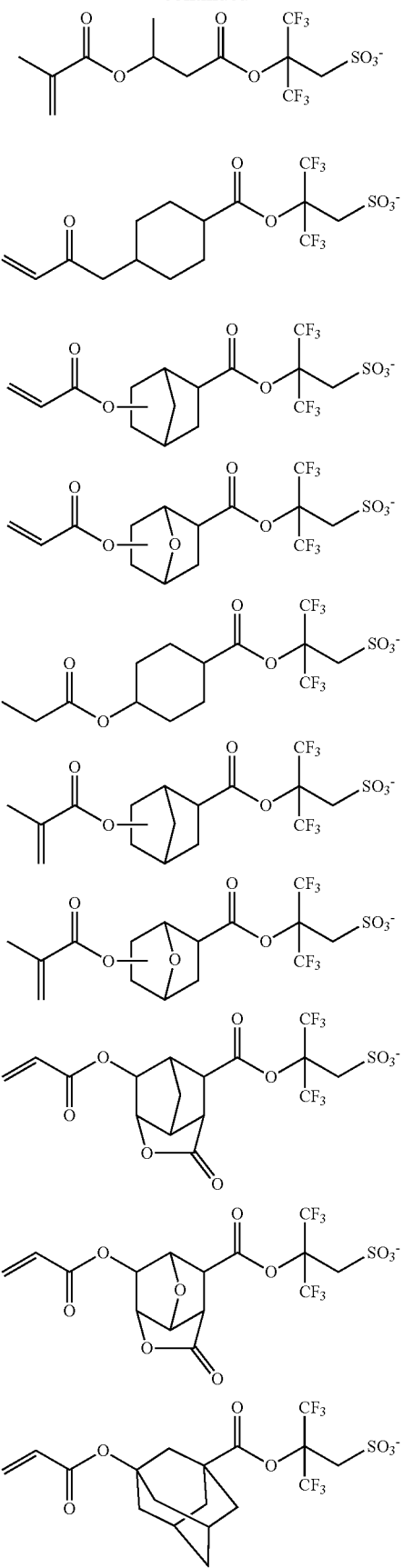

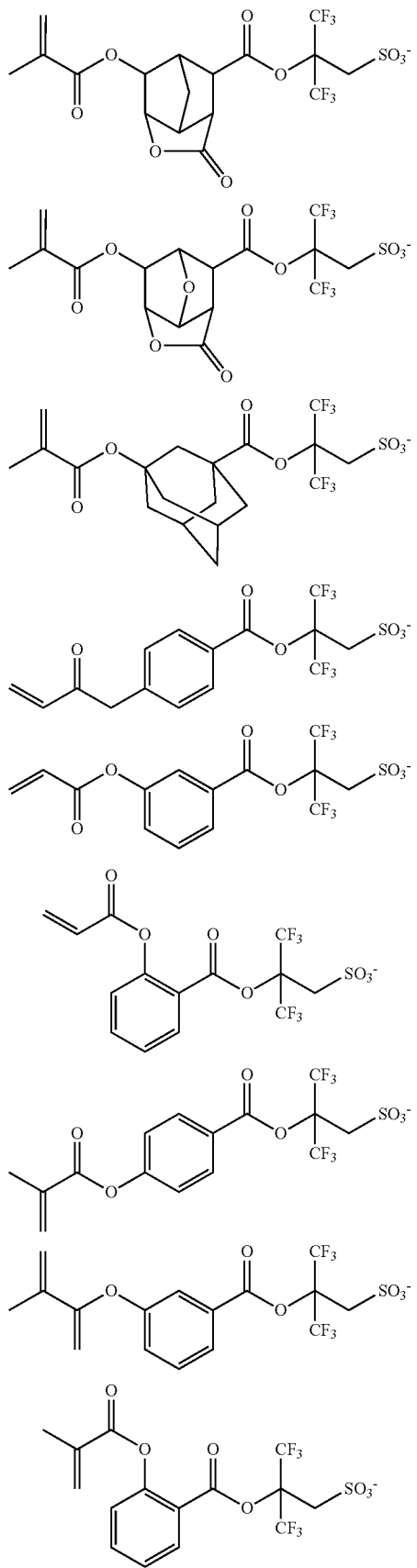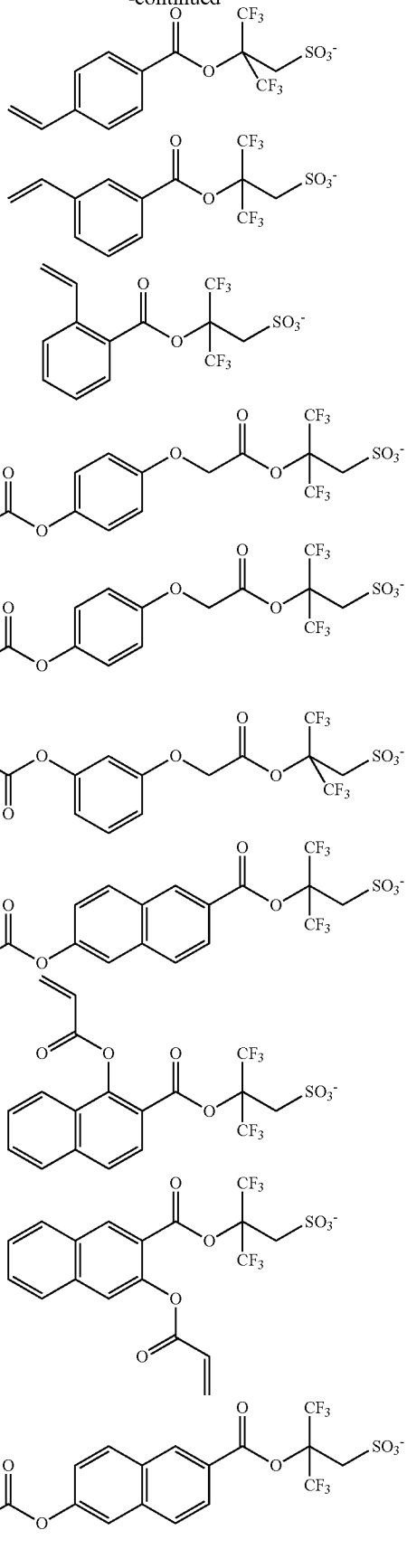

-continued

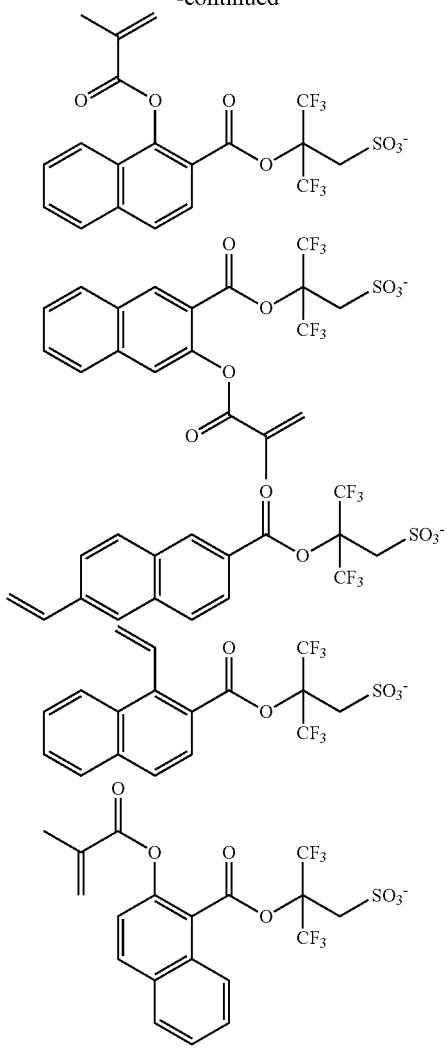

In the formula (a), $R^{100}$, $R^{200}$, and $R^{300}$ independently represent a heteroatom or a linear monovalent hydrocarbon group having 1 to 20 carbon atoms or a branched or cyclic monovalent hydrocarbon group having 3 to 20 carbon atoms, in which the hydrocarbon group may contain a heteroatom. Illustrative examples thereof include a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, a tricyclo[5.2.1.0$^{2,6}$]decanyl group, an adamantyl group, an adamantylmethyl group, a phenyl group, a naphthyl group, and an anthracenyl group. Moreover, a part of hydrogen atoms in these groups may be substituted with a group containing a heteroatom such as an oxygen atom, a sulfur atom, a nitrogen atom, and a halogen atom, or a part of carbon atoms in these group may be substituted with a group containing a heteroatom such as an oxygen atom, a sulfur atom, and a nitrogen atom so as to form a hydroxyl group, a cyano group, a carbonyl group, an ether bond, a thioether group, an ester bond, a sulfonate ester bond, a carbonate bond, a carbamate bond, a lactone ring, a sultone ring, a carboxylic anhydride, a haloalkyl group or the like.

Two or more of $R^{100}$, $R^{200}$, and $R^{300}$ may be bonded to each other to form a ring together with the sulfur atom in the formula. In this case, structures shown by the following formulae may be mentioned.

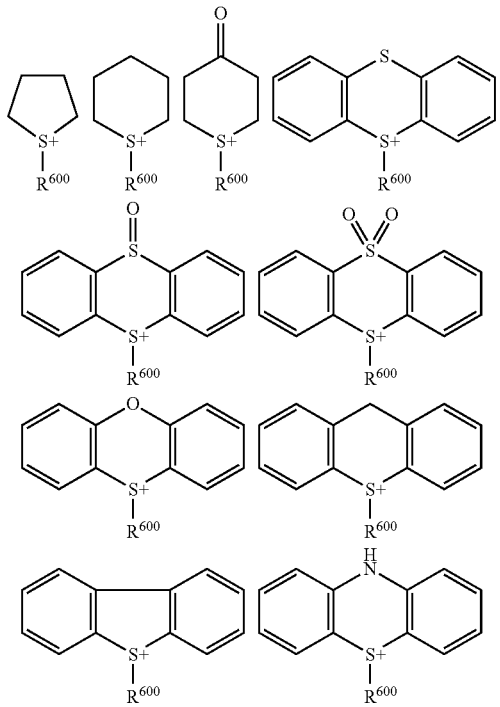

wherein, $R^{600}$ represents the same group as $R^{100}$, $R^{200}$, or $R^{300}$.

Illustrative examples of the structure of the sulfonium cation shown by the formula (a) are shown below, although the present invention is not limited thereto.

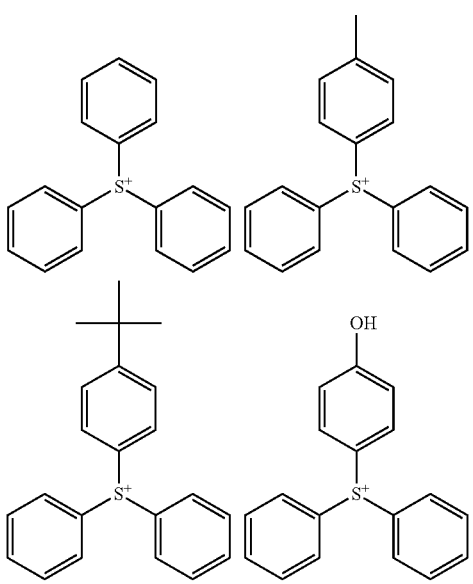

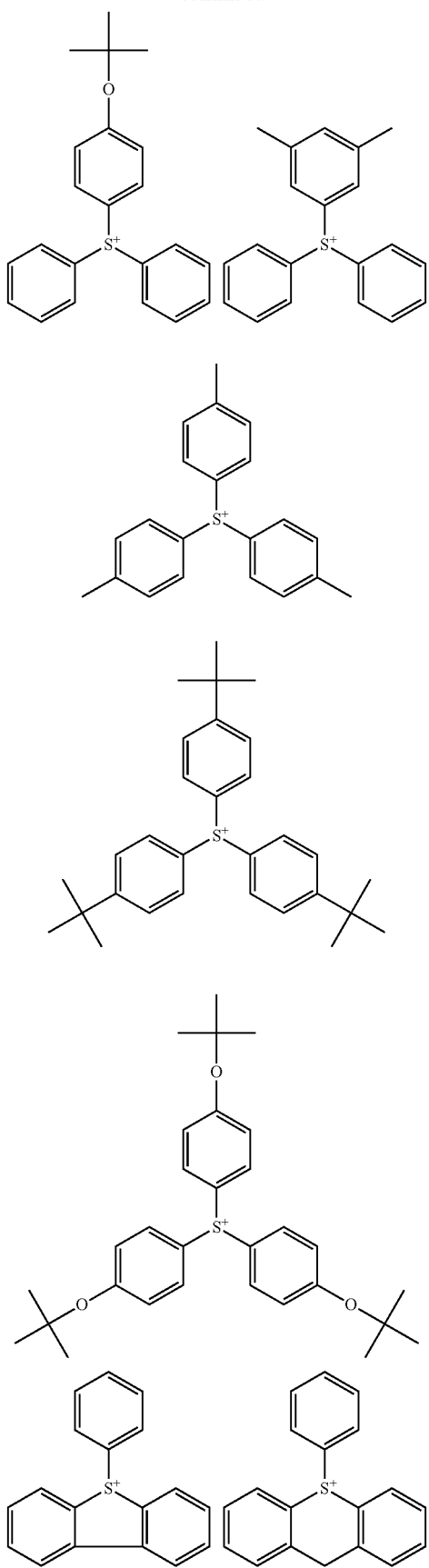
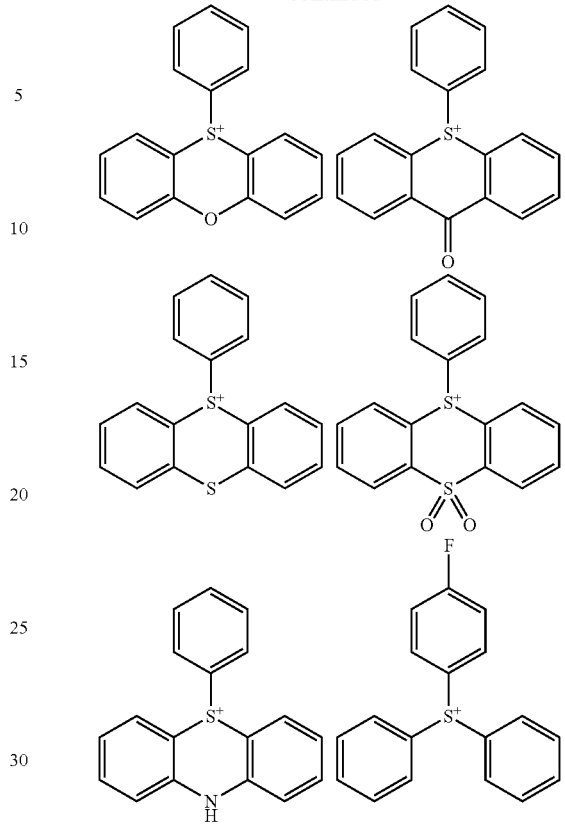

In the formula (b), $R^{400}$ and $R^{500}$ independently represent a heteroatom or a linear monovalent hydrocarbon group having 1 to 20 carbon atoms or a branched or cyclic monovalent hydrocarbon group having 3 to 20 carbon atoms, in which the hydrocarbon group may contain a heteroatom. Illustrative examples thereof include the same examples as $R^{100}$, $R^{200}$, and $R^{300}$ in the formula (a). Above all, aryl groups are preferable.

Preferable examples of the iodonium cation shown by the formula (b) include bis(4-methylphenyl)iodonium, bis(4-ethylphenyl)iodonium, bis(4-tert-butylphenyl)iodonium, bis(4-(1,1-dimethylpropyl)phenyl)iodonium, 4-methoxyphenylphenyliodonium, 4-tert-butoxyphenylphenyliodonium, 4-acryloyloxyphenylphenyliodonium, and 4-methacryloyloxyphenylphenyliodonium. In particular, bis(4-tert-butylphenyl)iodonium is more preferably used.

The repeating unit shown by the formula (1c) in the present invention may have a specific structure appropriately combining the aforementioned anion and cation structures.

The inventive polymer compound containing the repeating unit shown by the formula (1c) further contains one or more repeating units selected from the repeating unit shown by the formula (2) and the repeating unit shown by the formula (3). This polarizes the molecule and causes the polymer compound to adhere to a substrate. Such a polymer compound is effective in preparing a resist composition especially for electron beam or EUV.

Although "g" in the formula (2), which represents the number of hydroxyl groups bonded to the aromatic ring, is an integer of 0 to 3, the base resin preferably contains a repeating unit having a phenolic hydroxyl group or the repeating unit shown by the formula (3) to obtain solubility in an aqueous alkaline developer and substrate adhesion, as described later. Also, the base resin preferably contains a repeating unit of the formula (2) in which "g" is 1 or more, more preferably contains 50 mol % or more of the unit of formula (2) in which "g" is 1 or more. The reason is that such repeating units have high activity with respect to the insolubilization reaction with elimination of an acid-eliminatable group (an acid-labile group) contained in a repeating unit shown by the formula (U-2) described later, thereby providing high resolution. In addition, a repeating unit in which "g" is 0 may be used to adjust dissolution rate and tolerance to thermal vibration of the polymer, although it may be not contained according to the design.

The aromatic ring contained in the repeating unit shown by the formula (2) is bonded to the main chain by a single bond. "t" represents an integer of 0 to 2. When "t" is 0, 1, or 2, the aromatic group bonded to the main chain by a single bond is a benzene ring, a naphthalene ring, or an anthracene ring, respectively.

Among the repeating units shown by the formula (2), examples of the repeating unit in which "g" is 0 include repeating units obtained by polymerizing monomers such as styrene, vinylnaphthalene, vinylanthracene, and those whose aromatic ring is substituted with $R^2$ of a halogen atom, an acyloxy group, an alkyl group, or an alkoxy group.

Among the repeating units shown by the formula (2), the repeating unit in which "g" is 1 or more is a repeating unit derived from a monomer in which a 1-position substituted or unsubstituted vinyl group is bonded to an aromatic ring substituted with a hydroxyl group, typified by a hydroxystyrene unit. Preferable examples thereof include repeating units obtained by polymerizing 3-hydroxystyrene, 4-hydroxystyrene, 5-hydroxy-2-vinyl naphthalene, 6-hydroxy-2-vinyl naphthalene, or the like. More preferable are repeating units obtained by polymerizing 3-hydroxystyrene or 4-hydroxystyrene, shown by the formula (7).

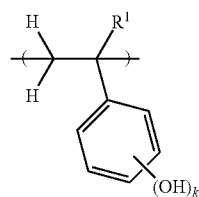

(7)

wherein $R^1$ is as defined above; and "k" represents 1 to 3.

The aromatic group contained in the repeating unit shown by the formula (3) is a benzene ring, a naphthalene ring, or an anthracene ring, and these aromatic groups may be substituted with $R^2$ of a halogen atom, an acyloxy group, an alkyl group, or an alkoxy group, as defined in the formula (2).

In the formula (3), G represents a single bond or an alkylene group having 1 to 10 carbon atoms and optionally containing an ether oxygen atom. Preferable examples of the alkylene group include a methylene group, an ethylene group, a propylene group, a butylene group, a pentylene group, a hexylene group, and structural isomers having carbon skeleton with branched or cyclic structure. In the case that ether oxygen is contained, when "p" in the formula (3) is 1, the ether oxygen may be at any position except the position between α-carbon and β-carbon relative to the ester oxygen. When "p" is 0, the atom bonding to the main chain is the ether oxygen, and second ether oxygen may be contained at any position except the position between α-carbon and β-carbon relative to the first ether oxygen.

In the formula (3), D represents a single bond, or a linear aliphatic hydrocarbon group having 1 to 10 carbon atoms or a branched or cyclic aliphatic hydrocarbon group having 3 to 10 carbon atoms with a valency of v+1, in which the aliphatic hydrocarbon group may contain an ether oxygen atom, a carbonyl group, or a carbonyloxy group, and a part or all of hydrogen atoms in the aliphatic hydrocarbon may be substituted with a fluorine atom. Preferable examples of the alkylene group include a methylene group, an ethylene group, a propylene group, a butylene group, a pentylene group, a hexylene group, and structural isomers having carbon skeleton with branched or cyclic structure. In the case that ether oxygen is contained, second ether oxygen may be contained at any position except the position between α-carbon and β-carbon relative to the first ether oxygen. In the case that a carbonyloxy group is contained, second ether oxygen may be contained at any position except the position between α-carbon and β-carbon relative to the ester oxygen.

In the formula (3), "r" represent 0 or 1. When "r" is 1, an aromatic ring is contained between the polymer main chain and the hydroxyl group bonding to the carbon adjacent to the fluorinated carbon. In other words, the aromatic ring is contained between the polymer main chain and the carbon atom bonding to $Rf_1$ and $Rf_2$ in the formula (3). "v", which represents the substitution number of D, is 1 or 2. In other words, when D is not a single bond, D has one or two hydroxyl groups bonding to the carbon adjacent to the fluorinated carbon.

When "r" is 0, "p" is 1, G is a single bond, and D is bonded to the polymer main chain via a carbonyloxy group. This means that D is directly bonded to the oxygen atom of the carbonyloxy group bonding to the polymer main chain. Also in this case, D has one or two hydroxyl groups bonding to the carbon adjacent to the fluorinated carbon.

Preferable examples of the repeating unit shown by the formula (3) are shown below, although not limited thereto.

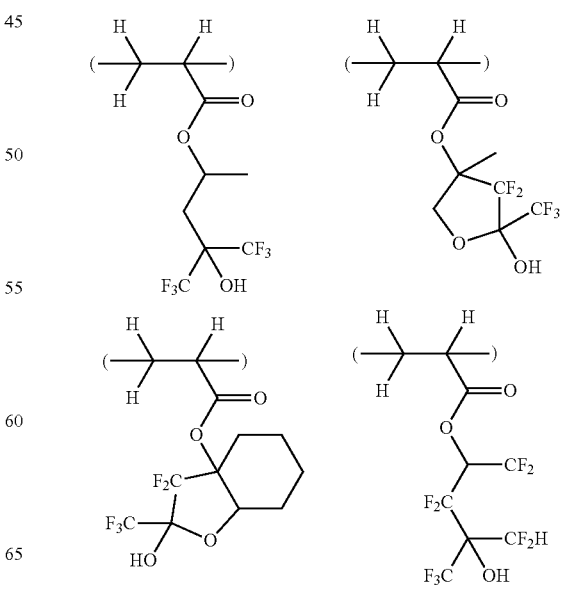

-continued
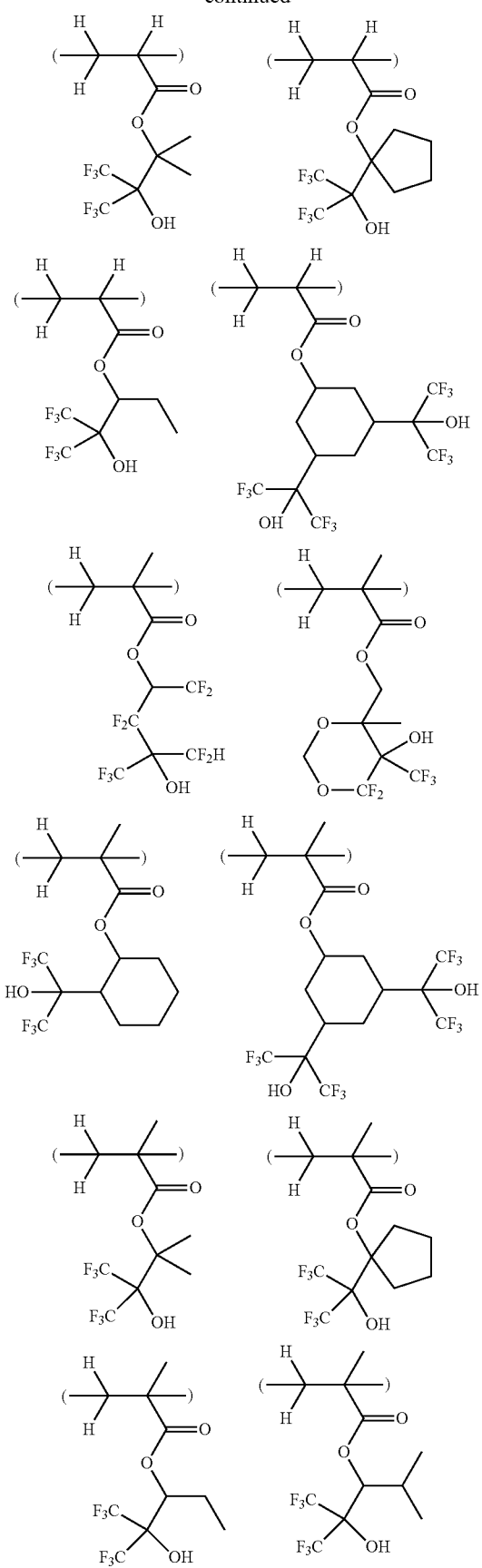
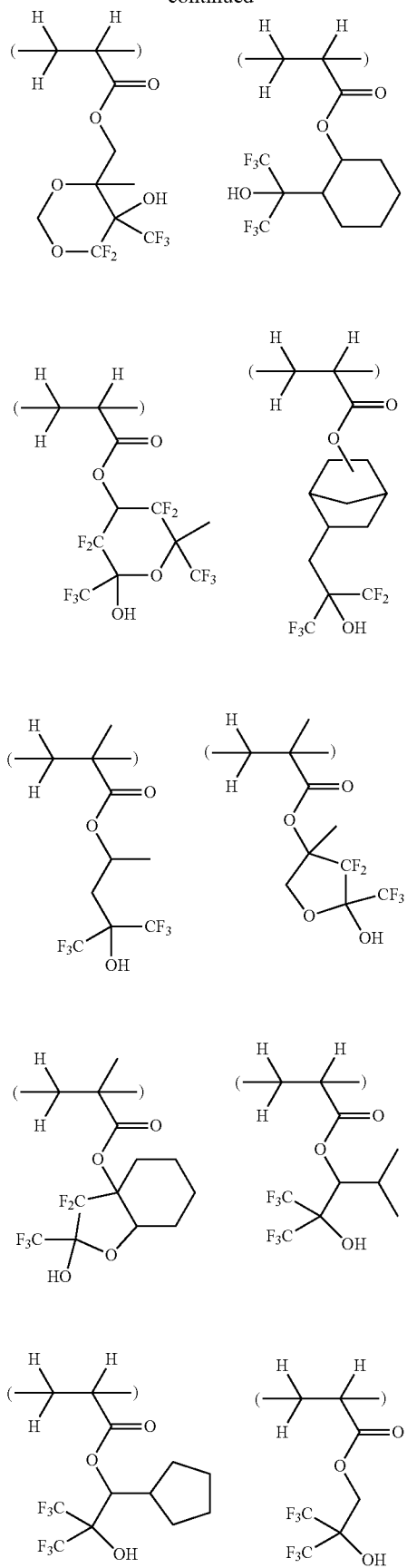

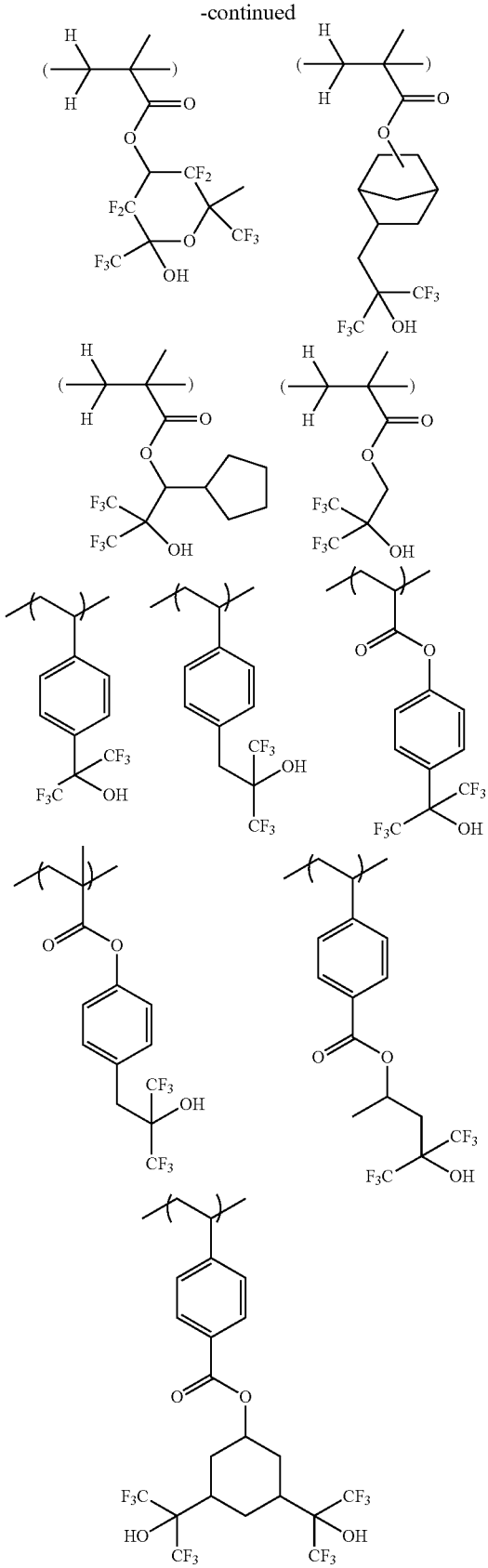

may be used in combination of multiple kinds. These units are preferably contained in an amount of 30 to 80 mol % with respect to the whole repeating units in the inventive polymer compound. Note that if the inventive polymer compound further contains a repeating unit shown by the formula (4) or a repeating unit shown by the formula (5), which provide higher etching resistance as described later, and this unit has a phenolic hydroxyl group as a substituent, the content of this unit is added to the above range.

The inventive polymer compound preferably further contains one or more repeating units selected from a repeating unit shown by the formula (4) and a repeating unit shown by the formula (5),

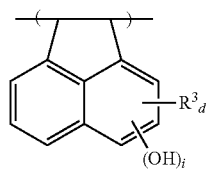

(4)

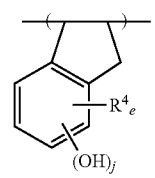

(5)

wherein $R^3$ and $R^4$ each represent a hydrogen atom, a halogen atom, a linear acyloxy group having 2 to 8 carbon atoms, a branched or cyclic acyloxy group having 3 to 8 carbon atoms, a linear alkyl group having 1 to 6 carbon atoms, a branched or cyclic alkyl group having 3 to 6 carbon atoms, a linear alkoxy group having 1 to 6 carbon atoms, or a branched or cyclic alkoxy group having 3 to 6 carbon atoms, in which a part or all of hydrogen atoms in the acyloxy group, the alkyl group, and the alkoxy group may be substituted with halogen; "i" and "j" represent an integer of 0 to 3; "d" represents an integer of 0 to 5; and "e" represents an integer of 0 to 3.

When the polymer compound containing, as constitutional components, one or more repeating units selected from the repeating unit shown by the formula (4) and the repeating unit shown by the formula (5) is used as a base resin of a resist composition, a cyclic structure is introduced to the main chain, which improves resistance to electron beam irradiation at etching and pattern inspection and etching resistance, as well as etching resistance is improved by the aromatic ring.

These repeating units may be used alone or in combination of multiple kinds. To obtain the effect of improving etching resistance, these repeating units are preferably contained in an amount of 5 mol % or more with respect to the whole repeating units constituting the polymer compound. When the repeating unit shown by the formula (4) and the repeating unit shown by the formula (5) have polarity and thus provide substrate adhesion by means of functional groups contained in the repeating units shown by the formula (4) and (5), or when they contain substituents protected by acid-labile groups and are solubilized in an alkaline by the action of acid, the introducing ratio of such units is added to the respective preferable ranges. In the case that the units contain no functional group or any other functional group, The repeating unit shown by the formula (2) and the repeating unit shown by the formula (3) may be one kind or the content thereof is preferably 30 mol % or less because development failure does not occur in this range.

The inventive polymer compound preferably further contains a repeating unit shown by the formula (U-2),

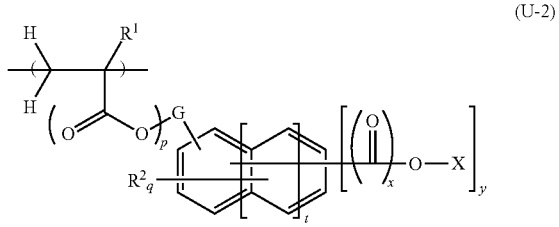

wherein $R^1$, $R^2$, G, "p", and "t" are as defined above; "x" represents 0 or 1; "y" represents an integer of 1 to 3; "q" represents an integer of (5+2t−y); X represents a hydrogen atom or an acid-labile group, provided that at least one X is an acid-labile group.

The repeating unit shown by the formula (U-2) corresponds to those obtained by protecting at least one phenolic hydroxyl group bonding to the aromatic ring of the repeating unit shown by the formula (2) or (3) by an acid-labile group; or those obtained by substituting the phenolic hydroxyl group with a carboxyl group and then protecting the carboxyl group by an acid-labile group.

The acid-labile group may be, in general, any group that is eliminated by acid and then provides an acidic group, as used in many known chemically amplified resist compositions, and is preferably an acetal group or a tertiary alkyl group.

In the case of using a tertiary alkyl group for protecting either the phenolic hydroxyl group or the carboxyl group, monomers to be polymerized are obtained by distillation. Thus, the tertiary alkyl group preferably has 4 to 18 carbon atoms. Examples of alkyl substituents bonded to tertiary carbon in the tertiary alkyl group include linear alkyl groups having 1 to 15 carbon atoms and branched or cyclic alkyl groups having 3 to 15 carbon atoms, in which the alkyl groups may contain oxygen-containing functional groups such as an ether bond and a carbonyl group. In addition, the alkyl substituents of the tertiary carbon may be bonded to each other to form a ring together with the carbon atom to which they are bonded.

Preferable examples of the alkyl substituent of the tertiary carbon include a methyl group, an ethyl group, a propyl group, an adamantyl group, a norbornyl group, a tetrahydrofuran-2-yl group, a 7-oxanorbornan-2-yl group, a cyclopentyl group, a 2-tetrahydrofuryl group, a tricyclo[5.2.1.0$^{2,6}$]decyl group, a 8-ethyl-8-tricyclo[5.2.1.0$^{2,6}$]decyl group, a 3-methyl-3-tetracyclo[4.4.0.1$^{2,5}$,1$^{7,10}$]dodecyl group, a tetracyclo[4.4.0.1$^{2,5}$,1$^{7,10}$]dodecyl group, and a 3-oxo-1-cyclohexyl group.

Illustrative examples of the tertiary alkyl group include a tert-butyl group, a tert-pentyl group, a 1-ethyl-1-methylpropyl group, a 1,1-diethylpropyl group, a 1,1,2-trimethylpropyl group, a 1-adamantyl-1-methylethyl group, a 1-methyl-1-(2-norbornyl)ethyl group, a 1-methyl-1-(tetrahydrofuran-2-yl)ethyl group, a 1-methyl-1-(7-oxanorbornan-2-yl)ethyl group, a 1-methylcyclopentyl group, a 1-ethylcyclopentyl group, a 1-propylcyclopentyl group, a 1-cyclopentylcyclopentyl group, a 1-cyclohexylcyclopentyl group, a 1-(2-tetrahydrofuryl)cyclopentyl group, a 1-(7-oxanorbornan-2-yl)cyclopentyl group, a 1-methylcyclohexyl group, a 1-ethylcyclohexyl group, a 1-cyclopentylcyclohexyl group, a 1-cyclohexylcyclohexyl group, a 2-methyl-2-norbornyl group, a 2-ethyl-2-norbornyl group, a 8-methyl-8-tricyclo[5.2.1.0$^{2,6}$]decyl group, a 8-ethyl-8-tricyclo[5.2.1.0$^{2,6}$]decyl group, a 3-methyl-3-tetracyclo[4.4.0.1$^{2,5}$,1$^{7,10}$]dodecyl group, a 3-ethyl-3-tetracyclo[4.4.0.1$^{2,5}$,1$^{7,10}$]dodecyl group, a 2-methyl-2-adamantyl group, a 2-ethyl-2-adamantyl group, a 1-methyl-3-oxo-1-cyclohexyl group, a 1-methyl-1-(tetrahydrofuran-2-yl)ethyl group, a 5-hydroxy-2-methyl-2-adamantyl group, and a 5-hydroxy-2-ethyl-2-adamantyl group, although not limited thereto.

In addition, an acetal group shown by the formula (8) is often used as the acid-labile group. This acetal group is a useful choice as an acid-labile group that relatively stably provides a pattern whose interface with a substrate is rectangular. In particular, a polycyclic alkyl group having 7 to 30 carbon atoms is preferably contained therein to achieve high resolution.

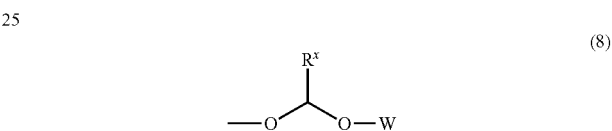

wherein $R^X$ represents a hydrogen atom, a linear alkyl group having 1 to 10 carbon atoms, or a branched or cyclic alkyl group having 3 to 10 carbon atoms; and W represents a linear alkyl group having 1 to 30 carbon atoms or a branched or cyclic alkyl group having 3 to 30 carbon atoms.

If W contains a polycyclic alkyl group, a bond is preferably formed between a secondary carbon of the polycyclic alkyl group and the acetal oxygen. This structure makes the polymer stable and enables the resist composition to have excellent storage stability and improved resolution, compared with the case that the bond is formed on a tertiary carbon of the cyclic structure. Moreover, this increases glass transition temperature (Tg) of the polymer and prevents a developed resist pattern from deforming by baking, compared with the case that W bonds on a primary carbon via a linear alkyl group having 1 or more carbon atoms.

Illustrative examples of the acetal group shown by the formula (8) include the following groups.

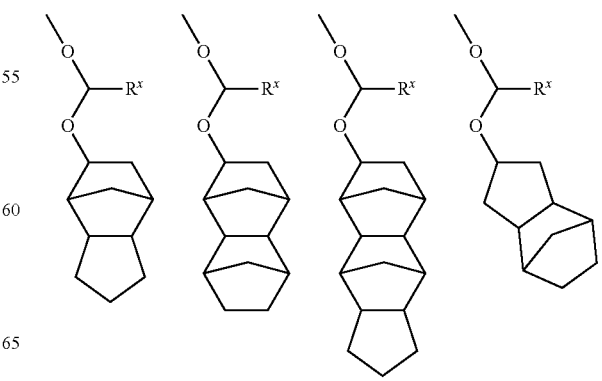

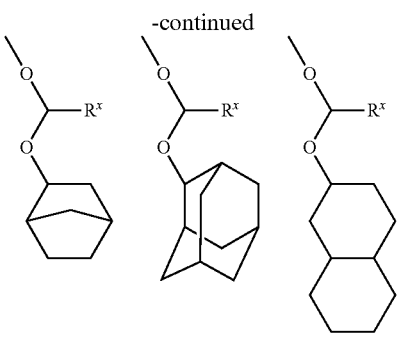

wherein $R^x$ is as defined above.

In the formula, $R^x$ represents a hydrogen atom, a linear alkyl group having 1 to 10 carbon atoms, or a branched or cyclic alkyl group having 3 to 10 carbon atoms. $R^x$ is appropriately selected according to design of sensitivity of a decomposable group to an acid. For example, if a strong acid is used for decomposition with relatively high stability, a hydrogen atom is selected. If relatively high reactivity is used to achieve high sensitivity to the change of pH, a linear alkyl group is selected. If, as mentioned above, a relatively large alkyl group is boned to the terminal such that the solubility is considerably changed by decomposition, $R^x$ is preferably a group in which secondary carbon bonds to the acetal carbon, although a combination of an acid generator and a base compound to be blended into the resist composition should also be considered. Examples of $R^x$ in which secondary carbon bonds to the acetal carbon include an isopropyl group, a sec-butyl group, a cyclopentyl group, and a cyclohexyl group.

As another example of the acid-labile group, —$CH_2COO$— tertiary alkyl group may be bonded to a phenolic hydroxyl group. The tertiary alkyl group used in this case may be the same tertiary alkyl group used for protecting a phenolic hydroxyl group as mentioned above.

As described above, the inventive polymer compound which contains the repeating unit having an acidic functional group protected by an acid-labile group (the unit that is protected by an acid-labile group and is solubilized in alkali by the action of an acid) can provide, when used as a base resin of a positive resist composition, a resist film in which an exposed part is soluble in an alkali aqueous solution.

The repeating unit shown by the formula (U-2) to be used may be one kind or a combination of multiple kinds, and is preferably contained in an amount of 5 to 45 mol % with respect to the whole repeating units in the polymer compound.

When the inventive polymer compound is used as a base resin of a chemically amplified resist composition, the polymer compound contains, as a repeating unit that generates an acid by exposure, the repeating unit shown by the formula (1c) in an amount of preferably 0.1 to 50 mol %, more preferably 1 to 30 mol %, with respect to the whole repeating units in the polymer compound. When the repeating unit shown by the formula (1c) is 0.1% or more, there is no fear that substrate adhesion decreases and a pattern cannot be obtained due to lack of acids generated by exposure. When the repeating unit shown by the formula (1c) is 50% or less, there is no fear that solvent-solubility of the polymer is too low to prepare a resist composition.

In addition, when the inventive polymer compound is used as a base resin of a chemically amplified resist composition, the total content of one or more repeating units selected from the repeating unit shown by the formula (2) and the repeating unit shown by the formula (3), which are main constitutional units, one or more repeating units selected from the repeating unit shown by the formula (4) and the repeating unit shown by the formula (5), and the repeating unit shown by the formula (U-2) is preferably 50 mol % or more of the whole repeating units constituting the inventive polymer compound. Such a polymer compound more surely yields the effect of the present invention when used as a base resin of a positive resist composition described later. The total content is more preferably 55 mol % or more, still more preferably 60 mol % or more.

If the whole constitutional units of the inventive polymer compound is consisting of the repeating unit shown by the formula (1c), the repeating unit shown by the formula (2), the repeating unit shown by the formula (3), the repeating unit shown by the formula (4), the repeating unit shown by the formula (5), and the repeating unit shown by the formula (U-2), both etching resistance and resolution are excellent. The polymer compound may contain repeating units other than the repeating unit shown by the formula (1c), the repeating unit shown by the formula (2), the repeating unit shown by the formula (3), the repeating unit shown by the formula (4), the repeating unit shown by the formula (5), and the repeating unit shown by the formula (U-2), including (meth)acrylate units protected by an acid-labile group commonly used and (meth)acrylate units containing an adhesion group such as lactone structure, as described in Patent Document 2. Such other repeating units may be used to finely adjust properties of the resist film, or may be not contained.

In addition, when the inventive polymer compound is used as a base resin of a chemically amplified resist composition, the polymer compound preferably has a weight average molecular weight (Mw) of 2,000 to 50,000, more preferably 3,000 to 20,000. When the weight average molecular weight is 2,000 or more, the pattern top is prevented from rounding, as conventionally known, and thus the resolution is not reduced, as well as LER is not deteriorated. On the other hand, although it also depends on the pattern to be resolved, the weight average molecular weight is preferably 50,000 or less to prevent LER from increasing. In particular, when a pattern with a pattern line width of 100 nm or less is to be formed, the weight average molecular weight is preferably controlled to be 20,000 or less.

Herein, the molecular weight is measured by gel permeation chromatography (GPC) using polystyrene as a standard sample. The GPC measurement can be performed with tetrahydrofuran (THF) solvent or dimethylformamide (DMF) solvent commonly used.

Furthermore, when the inventive polymer compound is used as a base resin of a chemically amplified resist composition, the polymer compound preferably has a molecular weight distribution (Mw/Mn) of 1.0 to 2.0, particularly in a narrow range of 1.0 to 1.8. Such a narrow range can prevent foreign matters from occurring on the pattern and the pattern profile from deteriorating after exposure.

The inventive polymer compound can be obtained by copolymerization of raw material monomers according to a known method, if necessary, in combination with protection reaction and deprotection reaction. The copolymerization reaction is preferably, but not particularly limited to, radical polymerization or anion polymerization. These methods are elaborated in WO2006/121096, Japanese Patent Laid-Open Publication No. 2008-102383, No. 2008-304590, and No. 2004-115630.

<Positive Resist Composition>

Furthermore, the present invention provides a positive resist composition containing the above polymer compound.

The inventive positive resist composition can attain fundamental resist properties by containing an organic solvent described later. If necessary, a basic compound, an acid generator other than the inventive polymer compound, other polymers, and a surfactant may be added thereto.

[Acid Generator]

The polymer compound used in the inventive positive resist composition contains the repeating unit that generates an acid by exposure. Thus, the resist composition is not necessarily required containing an acid generator, but an acid generator may be added to adjust the sensitivity and the resolution. The adding amount thereof is preferably 1 to 20 parts by mass, more preferably 2 to 15 parts by mass, based on 100 parts by mass of the whole polymer compound. The acid generator is appropriately selected from known acid generators according to physical properties to be adjusted. Preferable examples of the photo acid generator include a sulfonium salt, iodonium salt, sulfonyldiazomethane, N-sulfonyloxyimide, and oxime-o-sulfonate type acid generator. These acid generators may be used alone or in combination of two or more kinds.

Furthermore, illustrative examples of the acid generator are described in paragraphs (0122) to (0142) of Japanese Patent Laid-Open Publication No. 2008-111103.

Among the illustrative examples of the acid generator, arylsulfonate-type photo acid generators, which can generate an acid having an appropriate acidity to induce the deprotection reaction, are preferable.

As such an acid generator, compounds having the following sulfonium anion structure can be suitably used. As a counter cation, sulfonium cation mentioned above for examples of the cation structure of the formula (a) can be suitably used.

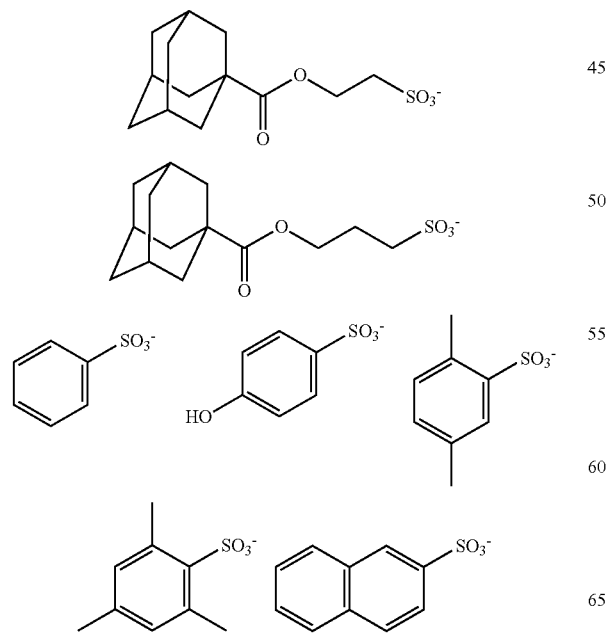

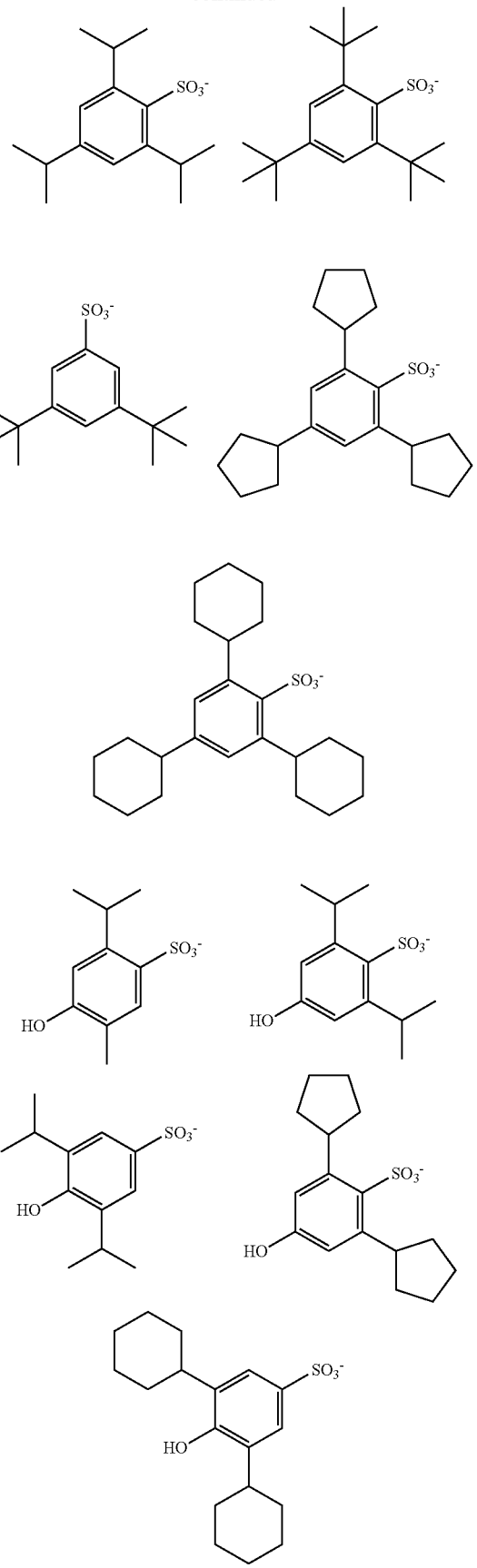

31
-continued
32
-continued
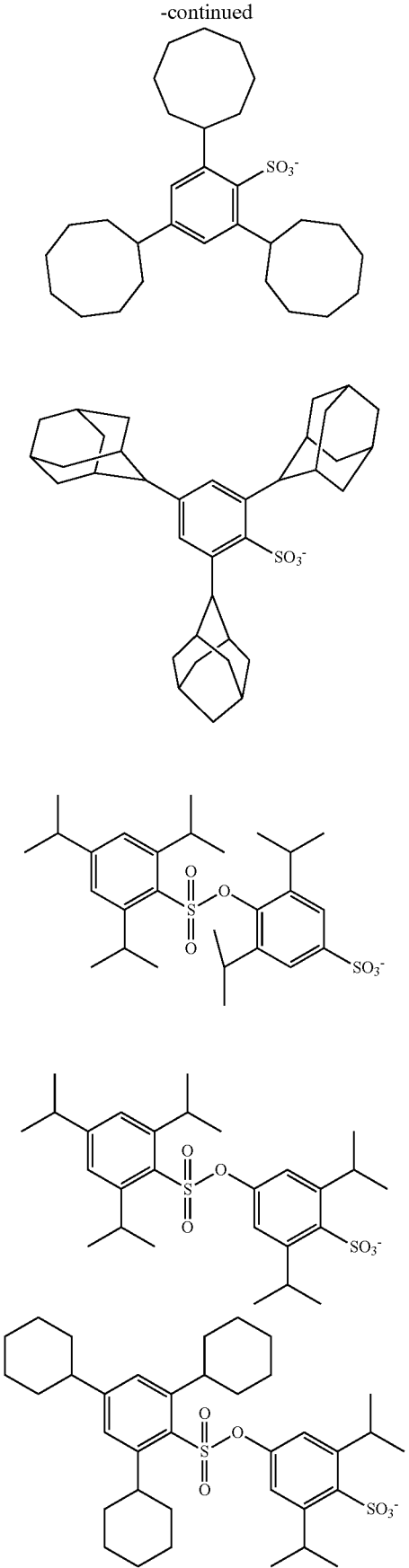
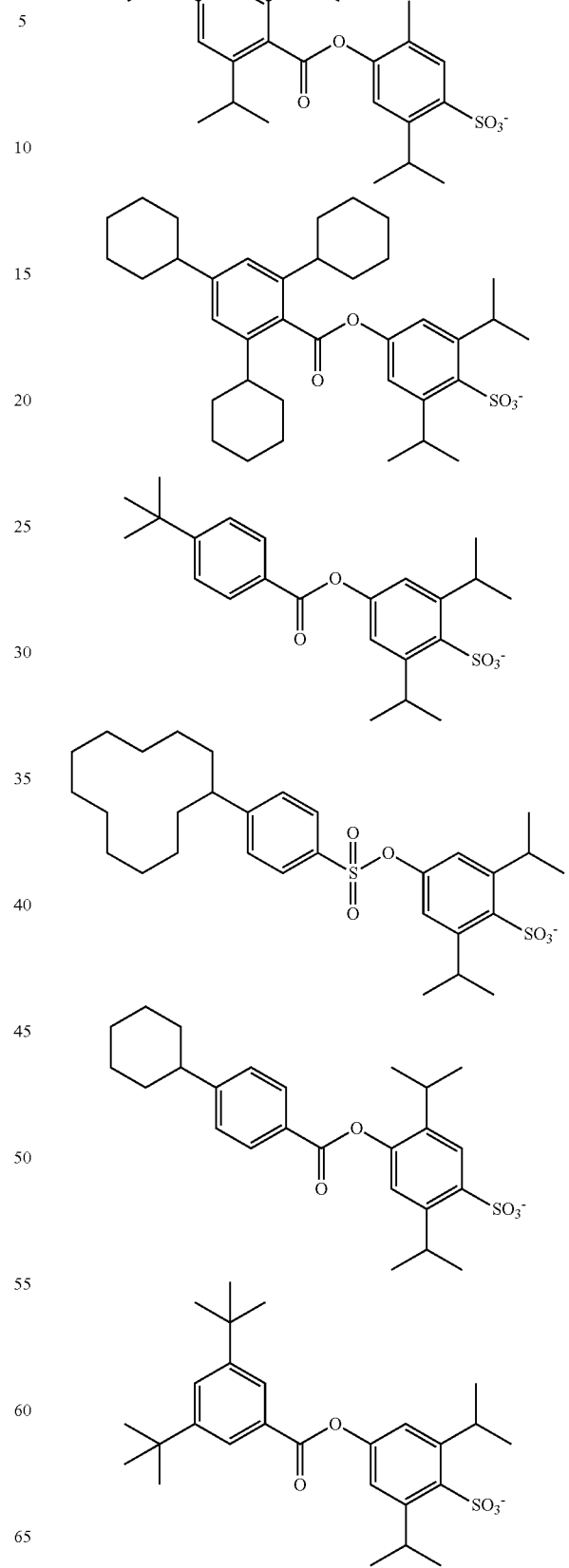

-continued
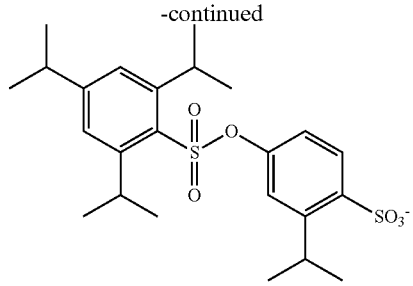
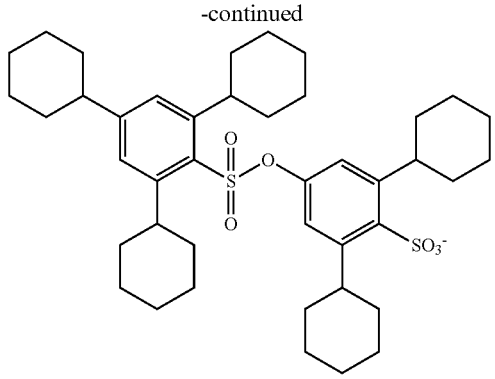
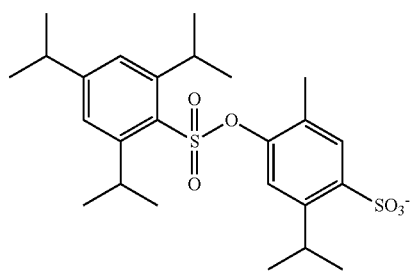
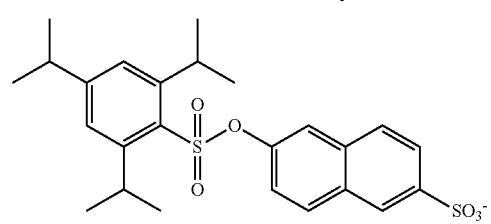
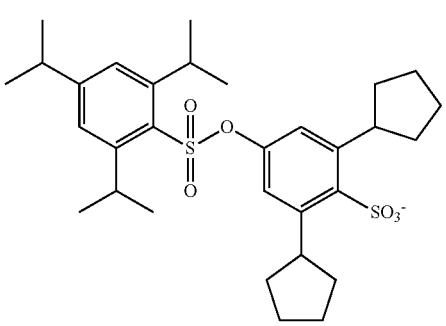
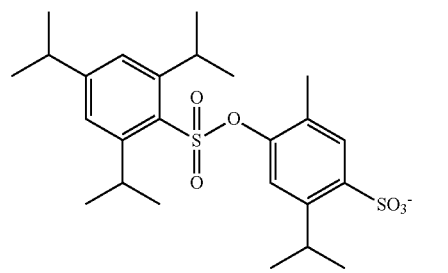
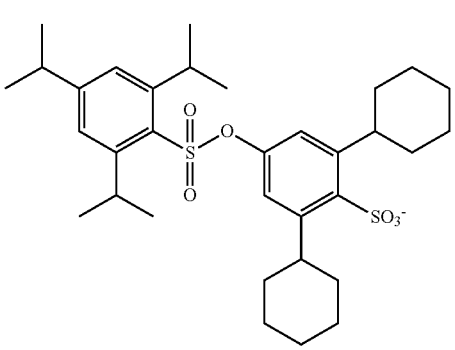
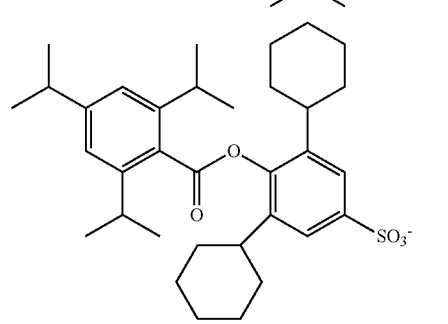
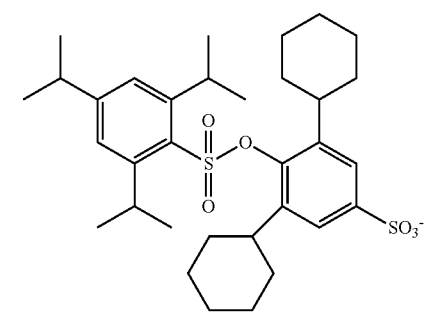
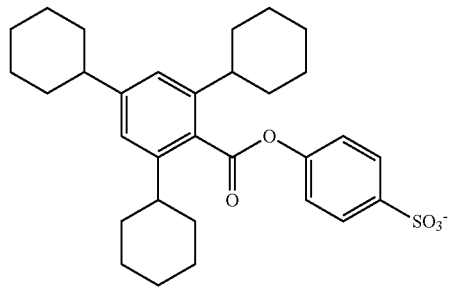
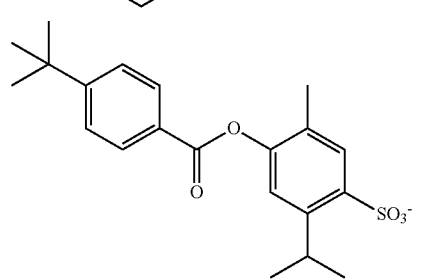

35
-continued
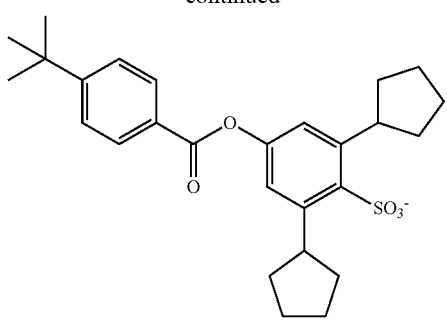
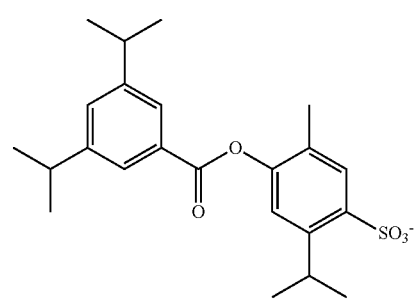
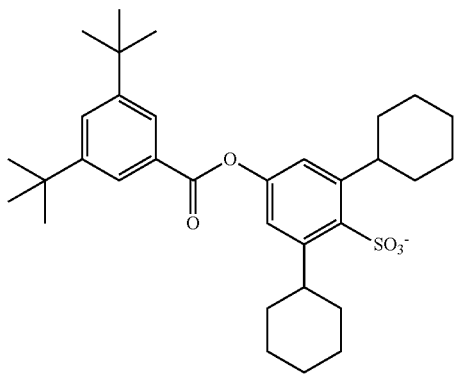
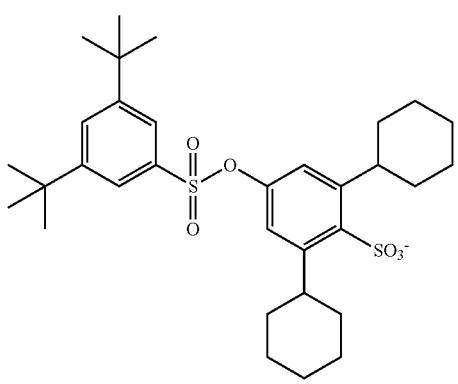
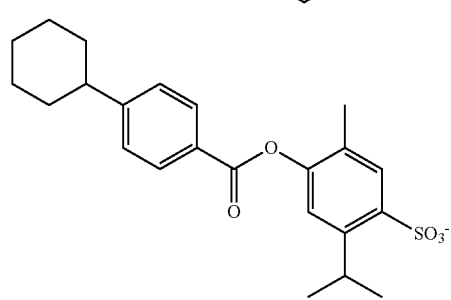
36
-continued
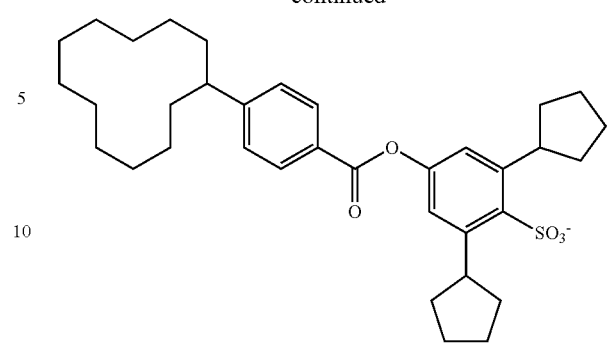
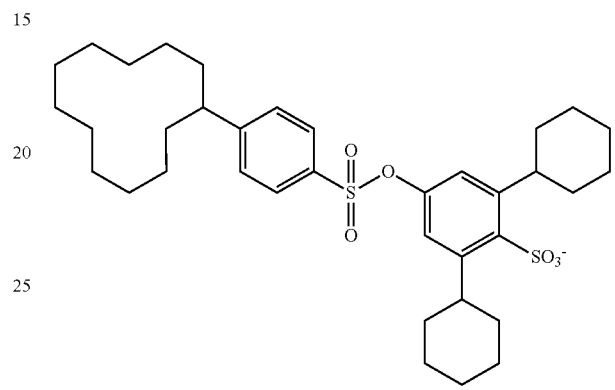
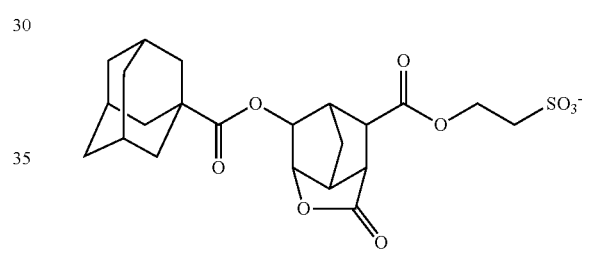
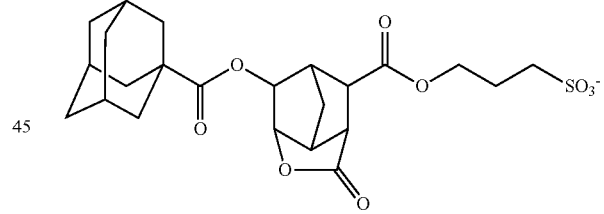
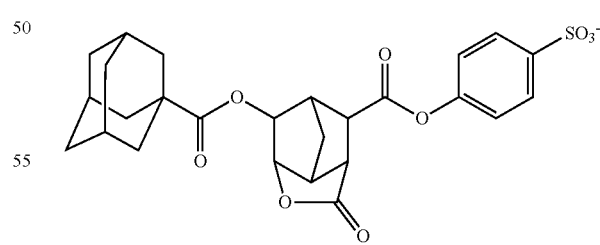
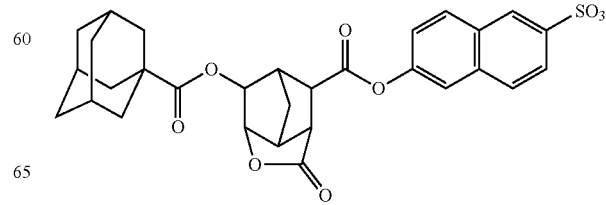

-continued
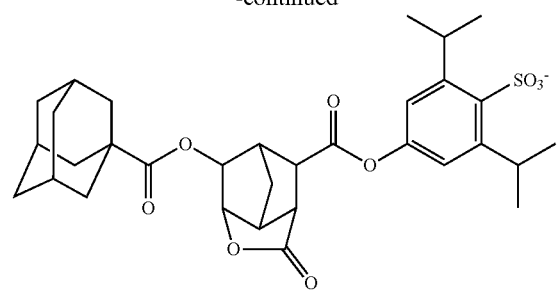
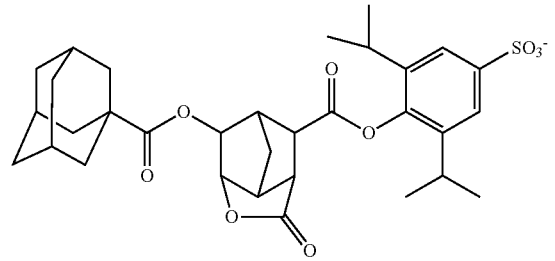
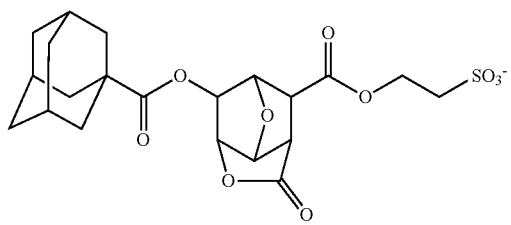
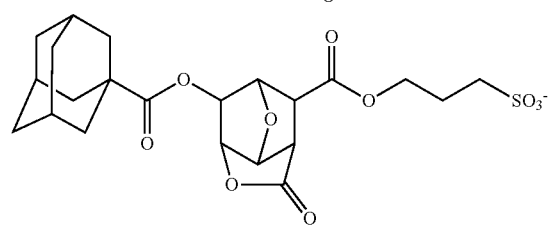
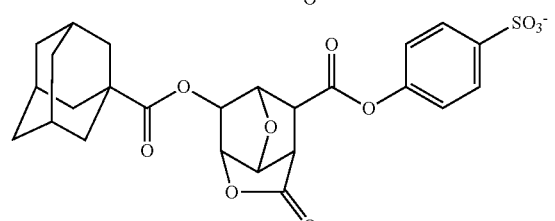
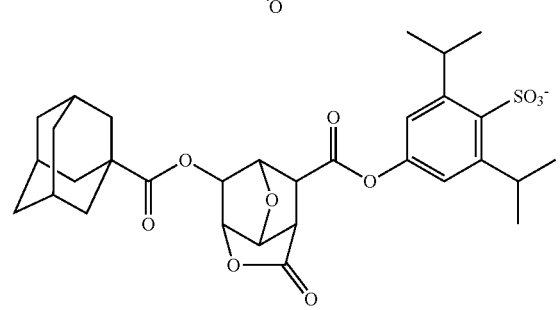
-continued
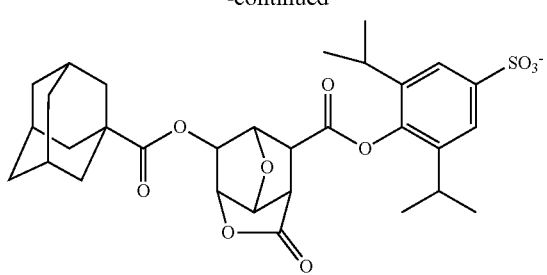
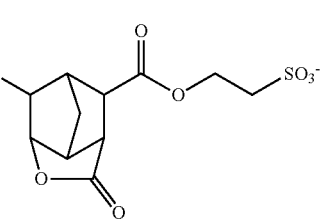
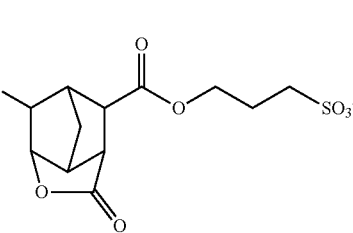
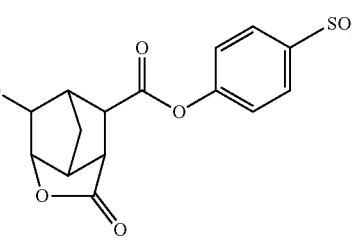
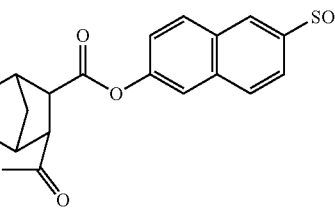
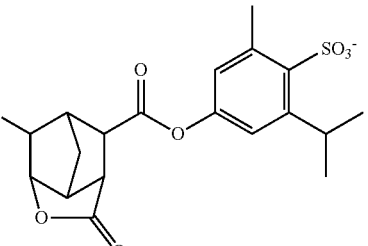
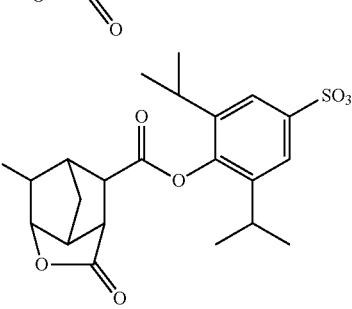

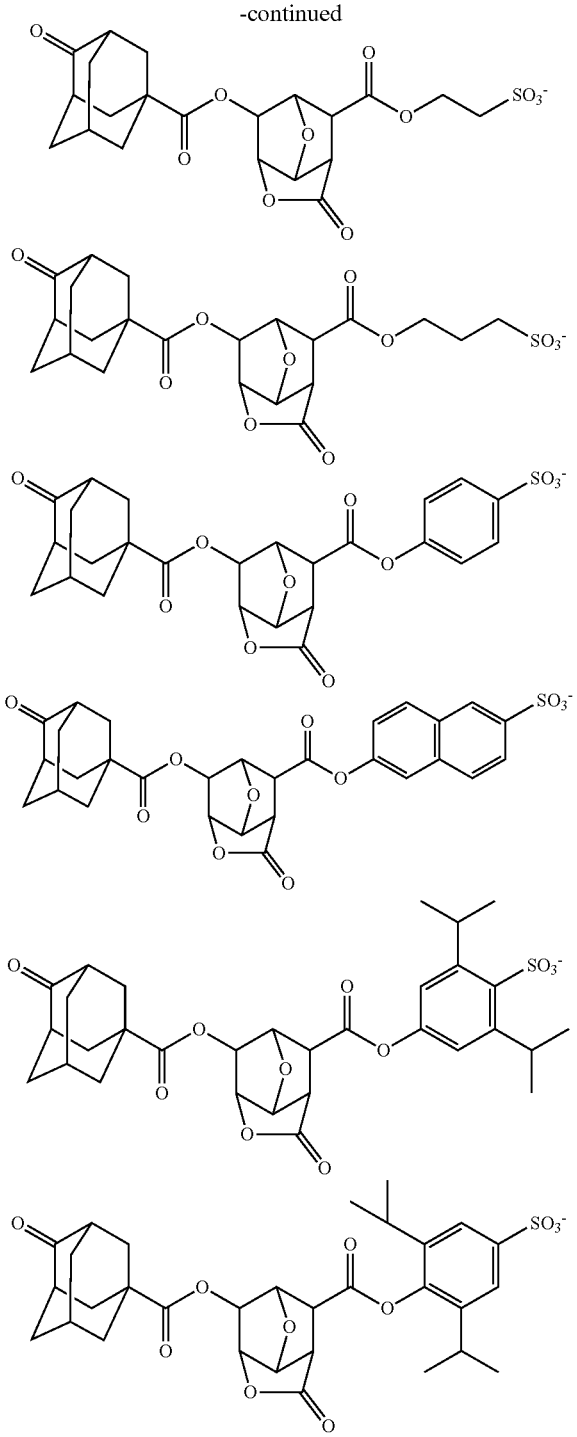

[Acid Diffusion Controlling Agent]

The inventive positive resist composition preferably contains an acid diffusion controlling agent to adjust sensitivity and achieve high resolution. The adding amount of the acid diffusion controlling agent is preferably 0.01 to 20 parts by mass, particularly preferably 0.05 to 10 parts by mass, based on 100 parts by mass of the whole polymer compound. Many basic compounds usable as the acid diffusion controlling agent are known (All Patent Documents 1 to 5 disclose those). Examples thereof include primary, secondary, and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, nitrogen-containing alcoholic compounds, amides, imides, carbamates, and ammonium salts. Many examples thereof are described in paragraphs (0146) to (0164) of Japanese Patent Laid-Open Publication No. 2008-111103 and U.S. Pat. No. 3,790,649. In general, all compounds described therein can be used. In addition, two or more basic compounds may be selected to use the mixture.

As the basic compound, tris(2-(methoxymethoxy)ethyl) amine, tris(2-(methoxymethoxy)ethyl)amine-N-oxide, morpholine derivatives, and imidazole derivatives are particularly preferable.

[Surfactant]

The inventive positive resist composition may contain a surfactant conventionally used to improve coating property. The surfactant to be used may be selected from many known materials as described in Patent Documents 1 to 5. In addition, a polymer containing fluorine as disclosed in Japanese Patent Laid-Open Publication No. 2008-304590 may be added.

The adding amount of the surfactant is preferably 0.01 to 2 parts by mass, particularly preferably 0.01 to 1 part by mass, based on 100 parts by mass of the whole polymer compound in the resist composition.

[Organic Solvent]

The organic solvent to be used for preparing the inventive positive resist composition may be any organic solvent that can dissolve the polymer compound, the acid generator, and other additives contained in the composition. Examples of the organic solvent include ketones such as cyclohexanone and methyl-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combination of two or more kinds, although it is not limited thereto. Among these organic solvents, ethyl lactate, propylene glycol monomethyl ether, propylene glycol monomethyl ether acetate, and a mixed solvent thereof, which are most excellent in solubility of an acid generator in the resist composition, are preferably used in the present invention.

The amount of the organic solvent to be used is preferably 1,000 to 10,000 parts by mass, particularly preferably 2,000 to 9,700 parts by mass, based on 100 parts by mass of the whole polymer compound in the resist composition. When the concentration is adjusted in this range, the resist film 10 to 300 nm thick can be stably formed with high flatness by spin coating.

Furthermore, a known dissolution inhibitor may be appropriately added to the inventive positive resist composition.

[Other Polymer Compound]

In addition, the inventive positive resist composition may contain, besides the inventive polymer compound, a polymer compound containing a repeating unit shown by the formula (6) and a repeating unit having at least one fluorine atom (hereinafter, this compound is referred to as "polymer compound X"),

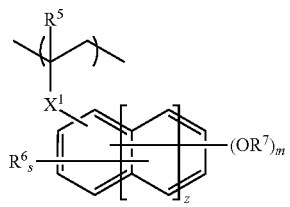
(6)

wherein $R^5$ represents a hydrogen atom or a methyl group; $R^6$ and $R^7$ represent a hydrogen atom or a linear or branched hydrocarbon group having 1 to 5 carbon atoms and optionally containing a heteroatom; $X^1$ represents a single bond, —C(=O)O—, or —C(=O)NH—; "z" represents 0 or 1; "m" represents an integer of 1 to 3; and "s" represents an integer of (5+2z−m).

Examples of the hydrocarbon group represented by $R^6$ in the formula (6) include alkyl groups, alkenyl groups, and alkynyl groups; and alkyl groups are preferable. Illustrative examples of the alkyl group include a methyl group, an ethyl group, a n-propyl group, an isopropyl group, a n-butyl group, an isobutyl group, a sec-butyl group, and a n-pentyl group. In addition, a heteroatom such as an oxygen atom, a sulfur atom, and a nitrogen atom may be contained at the middle of a carbon-carbon bond in these groups.

In the formula (6), the substituent shown by —OR$^7$ is preferably a hydrophilic group. In this case, $R^7$ is preferably a hydrogen atom or an alkyl group having 1 to 5 carbon atoms and containing an oxygen atom at the middle of a carbon-carbon bond.

Illustrative examples of the repeating unit shown by the formula (6) are shown below, although not limited thereto.

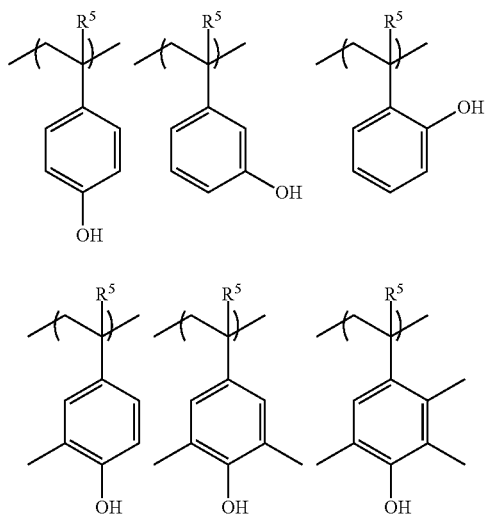

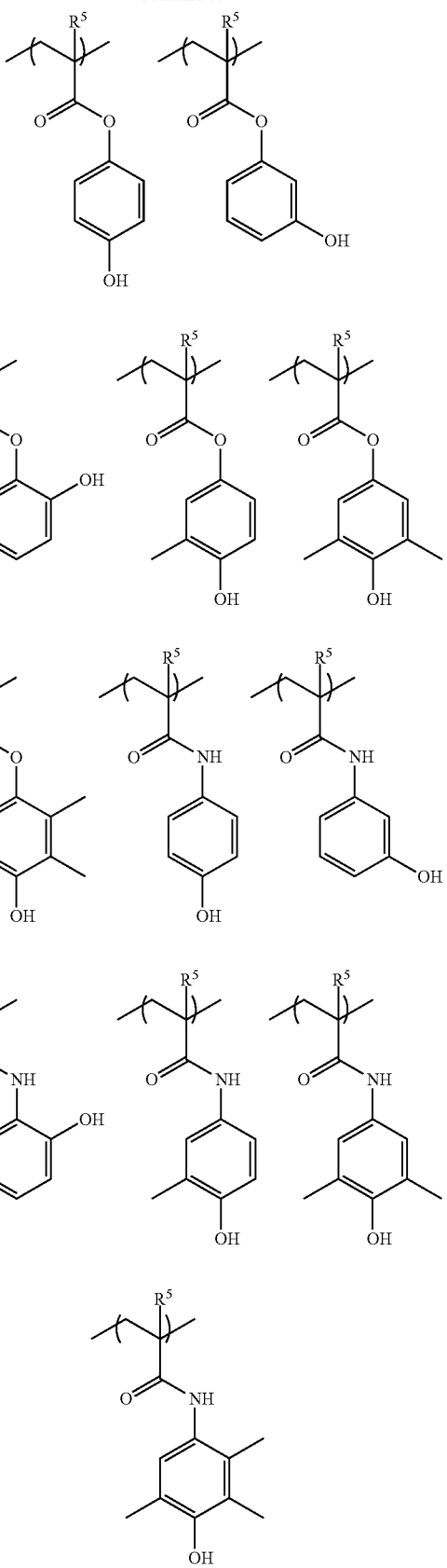

wherein $R^5$ is as defined above.

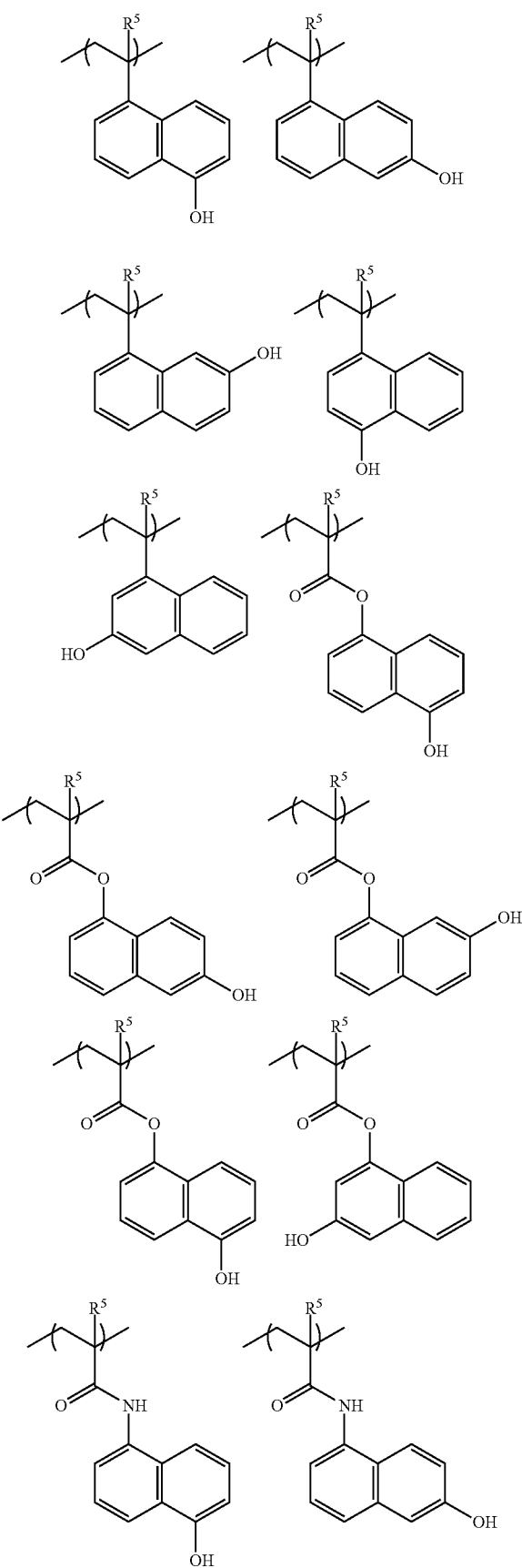

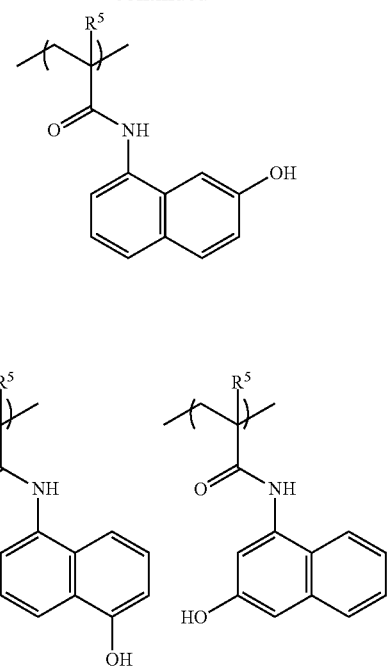

wherein R⁵ is as defined above.

In the repeating unit shown by the formula (6), $X^1$ is preferably —C(=O)O— or —C(=O)NH—. When $X^1$ contains a carbonyl group, acid-trapping ability derived from an antistatic film is improved. Moreover, $R^5$ is preferably a methyl group. When $R^5$ is a methyl group, a rigid polymer with higher glass transition temperature (Tg) can be obtained, and thus the acid diffusion is controlled. This allows the resist film to have temporal stability and prevents the resolution and the pattern profile from deteriorating.

The repeating unit having at least one fluorine atom is preferably at least one repeating unit selected from repeating units shown by the formulae (9) to (12).

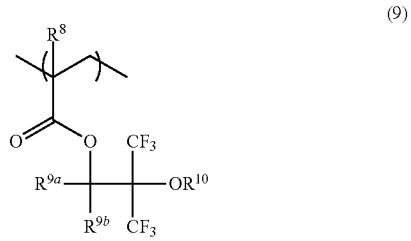

(9)

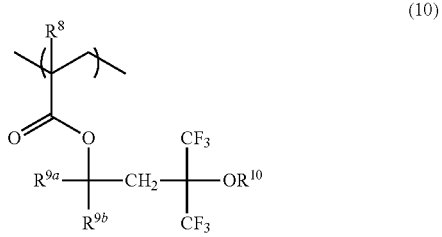

(10)

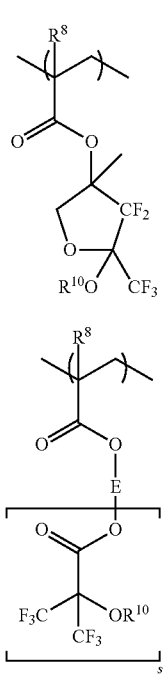

(11)

(12)

wherein each $R^8$ represents a hydrogen atom, a fluorine atom, a methyl group, or a trifluoromethyl group; $R^{9a}$ and $R^{9b}$ each represent a hydrogen atom, a linear alkyl group having 1 to 10 carbon atoms, or a branched or cyclic alkyl group having 3 to 10 carbon atoms; $R^{10}$ represents a hydrogen atom, a linear monovalent hydrocarbon group or fluorinated monovalent hydrocarbon group having 1 to 15 carbon atoms, a branched or cyclic monovalent hydrocarbon group or fluorinated monovalent hydrocarbon group having 3 to 15 carbon atoms, or an acid-labile group, provided that when $R^{10}$ is the monovalent hydrocarbon group or the fluorinated hydrocarbon group, an ether bond (—O—) or a carbonyl group (—C(=O)—) may be contained in the middle of a carbon-carbon bond; E represents a linear hydrocarbon group or fluorinated hydrocarbon group having 1 to 20 carbon atoms or a branched or cyclic hydrocarbon group or fluorinated hydrocarbon group having 3 to 20 carbon atoms with a valency of s+1; and "s" is an integer of 1 to 3.

Examples of $R^{9a}$ and $R^{9b}$ include a methyl group, an ethyl group, a n-propyl group, an isopropyl group, a cyclopropyl group, a n-butyl group, an isobutyl group, a sec-butyl group, a tert-butyl group, a cyclobutyl group, a n-pentyl group, a cyclopentyl group, a n-hexyl group, a cyclohexyl group, a n-heptyl group, a n-octyl group, a n-nonyl group, a n-decyl group, an adamantyl group, and a norbornyl group. Among them, linear alkyl groups having 1 to 6 carbon atoms and branched or cyclic alkyl groups having 3 to 6 carbon atoms are preferable.

Examples of the monovalent hydrocarbon group represented by $R^{10}$ include alkyl groups, alkenyl groups, and alkynyl groups; and alkyl groups are particularly preferable.

Illustrative examples of the alkyl group include, besides the groups mentioned above, a n-undecyl group, a n-dodecyl group, a tridecyl group, a tetradecyl group, and a pentadecyl group. Examples of the monovalent fluorinated hydrocarbon group represented by $R^{10}$ include the above-mentioned monovalent hydrocarbon group in which a part or all of hydrogen atoms bonding to carbon atoms is substituted with a fluorine atom.

Examples of the acid-labile group include the above-mentioned tertiary alkyl groups and acetal groups shown by the formula (8).

Examples of E, the hydrocarbon group or fluorinated hydrocarbon group with a valency of s+1, include groups that have hydrogen atoms "s" less than the above-mentioned monovalent hydrocarbon groups or monovalent fluorinated hydrocarbon groups.

Illustrative examples of the repeating units shown by the formulae (9) to (12) are shown below, although not limited thereto.

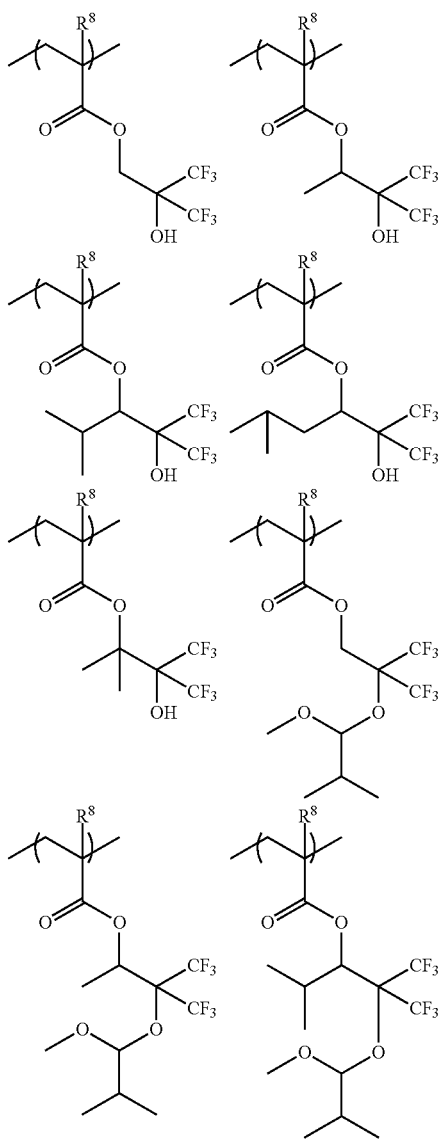

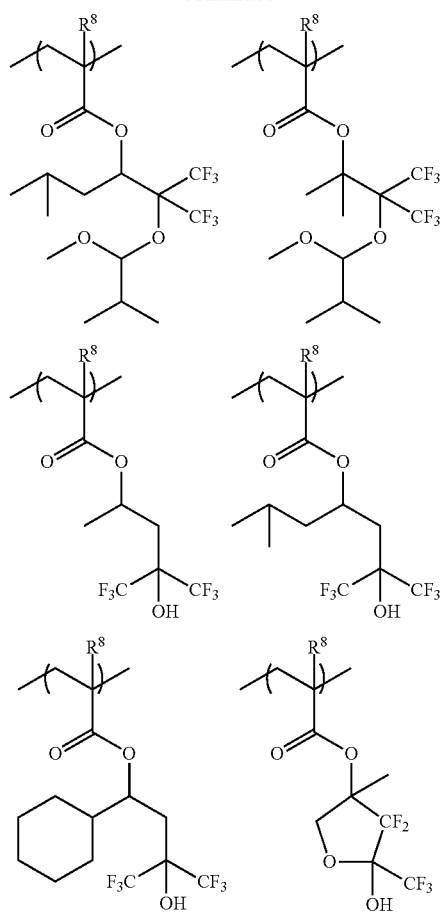
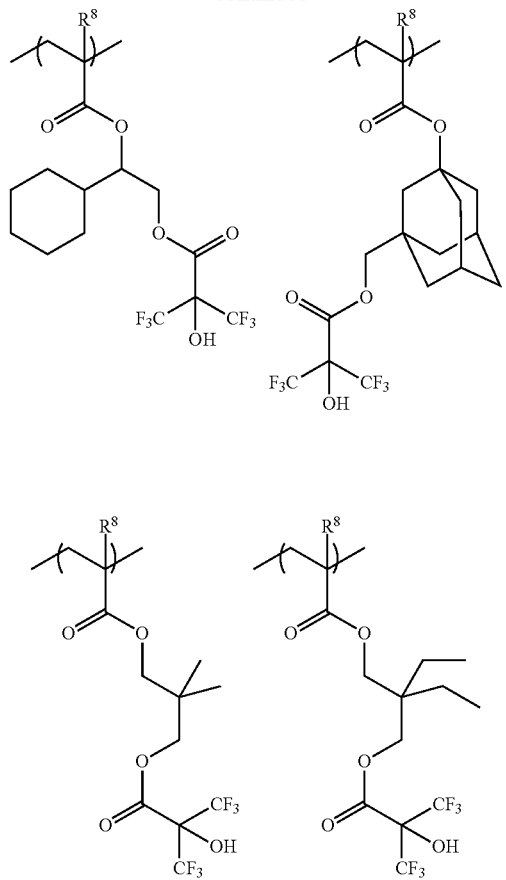
wherein R⁸ is as defined above.
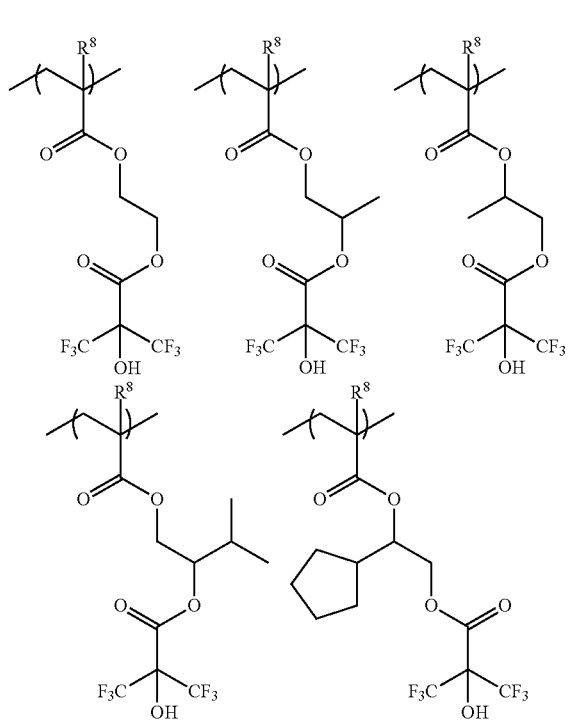
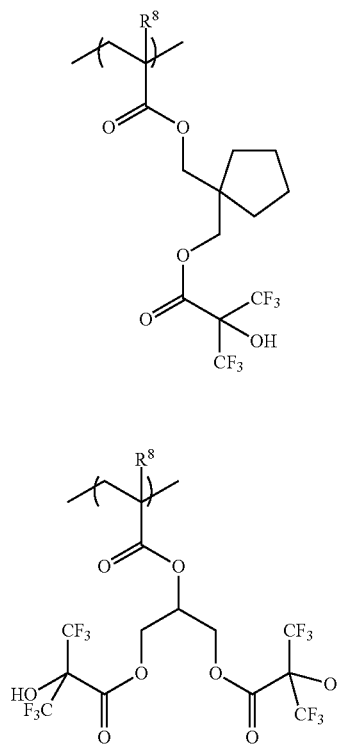

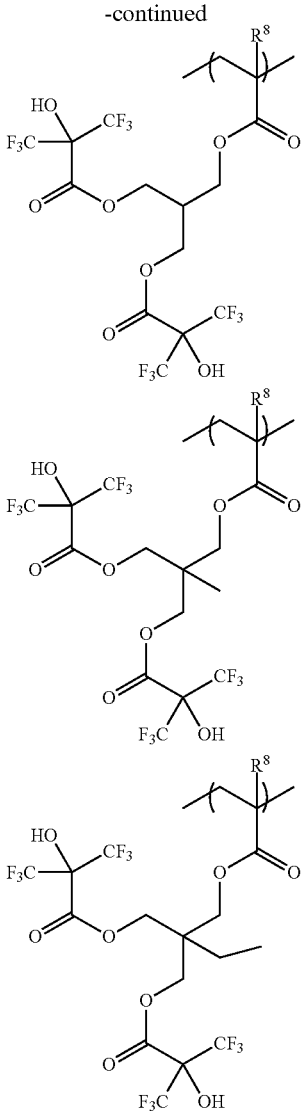

wherein R⁸ is as defined above.

The repeating units shown by the formulae (9) to (12) to be used may be one kind alone or a combination of two or more kinds. These repeating units are preferably contained in an amount of 20 to 95 mol % of the whole repeating units in the polymer compound.

The polymer compound X may contain other repeating unit besides the repeating unit shown by the formula (6) and the repeating unit having at least one fluorine atom. Examples of the repeating unit that may be contained are described in paragraphs (0046) to (0078) of Japanese Patent Laid-Open Publication No. 2014-177407. When the polymer compound X contains the other repeating unit, the content thereof is preferably 50 mol % or less of the whole repeating units.

The polymer compound X can be obtained by copolymerization of respective monomers according to a known method, if necessary, in combination with protection reaction and deprotection reaction. The copolymerization reaction is preferably, but not particularly limited to, radical polymerization or anion polymerization. These methods are elaborated in Japanese Patent Laid-Open Publication No. 2004-115630.

The polymer compound X preferably has a weight average molecular weight (Mw) of 2,000 to 50,000, more preferably 3,000 to 20,000. When Mw is 2,000 or more, the acid diffusion is not promoted, and thus reduction in resolution and temporal stability can be prevented. Moreover, when Mw is not excessively large, solubility in a solvent is not decreased, and thus coating defects can be prevented. In the present invention, Mw is measured by gel permeation chromatography (GPC) using a tetrahydrofuran (THF) solvent in terms of polystyrene.

The polymer compound X preferably has a molecular weight distribution (Mw/Mn) of 1.0 to 2.2, particularly preferably 1.0 to 1.7.

The formulation amount of the polymer compound X in the inventive positive resist composition is preferably 0.1 to 50 parts by mass, more preferably 0.5 to 20 part by mass, based on 100 parts by mass of the inventive polymer compound.

When the positive resist composition containing the polymer compound X is used, for example, to form a resist film on a photomask blank, the resist film can be successfully coated with an antistatic film.

<Laminate>

Furthermore, the present invention provides a laminate including a resist film formed from the inventive positive resist composition on a photomask blank. The laminate preferably further includes an antistatic film on the resist film.

The electron lithography can inherently cause a phenomenon of electrification (charge-up), in which electric charge is accumulated on or in a resist film during exposure. This electrification causes an orbit of incident electron beam to be bent and thus significantly reduces accuracy of drawing a mask pattern. In order to prevent the reduction of pattern drawing accuracy, it is essential to coat the resist film with an antistatic film so that the charge is dissipated for drawing a fine pattern.

As mentioned above, when the positive resist composition containing, besides the inventive polymer compound, especially the polymer compound X is used to form a resist film on a photomask blank, the resist film can be successfully coated with an antistatic film. Such a photomask blank, on which the resist film and the antistatic film are formed, can provide a mask pattern with high accuracy when used to produce a photomask by directly drawing the resist film with a high energy beam.

Moreover, such a photomask blank, on which the resist film is formed from the inventive positive resist composition that contains the polymer compound X, enables the resist film to be blocked from acids and acid-neutralizing components to be penetrated from the antistatic film, thus dramatically improving temporal stability of the resist film coated with the antistatic film.

<Resist Patterning Process>

Furthermore, the present invention provides a resist patterning process including the step of: forming a resist film on a substrate to be processed from the inventive positive resist composition; exposing the formed resist film to a high energy beam by pattern irradiation; developing the exposed resist film with an alkaline developer to form a resist pattern.

To form a pattern with the inventive positive resist composition, a well-known lithography technology may be employed. In general, the composition is applied onto a substrate to be processed by a method such as spin coating so as to give a film thickness of 0.05 to 2.0 μm and then pre-baked on a hot plate at 60 to 150° C. for 1 to 10 minutes, preferably at 80 to 140° C. for 1 to 5 minutes. Then, the film is exposed to a high energy beam through a mask for forming an intended pattern or by beam exposure. The exposure may be performed by a usual exposure method or, if necessary, an immersion method in which a liquid is placed between the mask and the resist film. In this case, a top coat that is insoluble in water can be used. Then, post exposure baking (PEB) is performed on a hot plate at 60 to 150° C. for 1 to 10 minutes, preferably at 80 to 140° C. for 1 to 5 minutes. The film is then developed by a usual method such as dip method, puddle method, and spray method, with a developer of an alkaline aqueous solution such as 0.1 to 5 mass %, preferably 2 to 3 mass % tetramethylammonium hydroxide (TMAH) solution, for 0.1 to 3 minutes, preferably 0.5 to 2 minutes. The intended pattern can be thus formed on the substrate.

[Substrate to be Processed]

The substrate to be processed may be, for example, a substrate for manufacturing integrated circuits, such as a silicon wafer having a surface layer of Si, SiO$_2$, SiN, SiON, TiN, WSi, BPSG (Boron Phosphorus Silicate Glass), SOG (Spin on Glass), or an organic antireflection film; or a substrate (photomask blank) for manufacturing mask circuits, such as a quartz substrate having a surface layer of Cr, CrO, CrON, or MoSi. In particular, a substrate having an outermost surface formed of a chromium material is preferable.

[High Energy Beam]

The high energy beam may be a far ultraviolet ray, an excimer layer beam, an X-ray, an electron beam, or an EUV. In particular, an EUV and an electron beam are preferable. The exposure dose of the high energy beam is preferably 1 to 200 mJ/cm$^2$, more preferably 10 to 100 mJ/cm$^2$.

The resist film formed from the inventive positive resist composition has especially high etching resistance. Thus, this film can withstand severe etching conditions and can be suitably used under conditions that require small LER. In addition, this film is particularly useful for a substrate (a substrate to be processed) coated with a material that is difficult to adhere to the resist pattern and easily causes pattern peeling-off and pattern collapse, and is useful for patterning on a substrate, especially on a photomask blank, having a film formed by sputtering metal chromium or a chromium compound containing one or more light elements such as oxygen, nitrogen, and carbon.

EXAMPLES

Hereinafter, the present invention will be specifically described with reference to Synthesis Examples, Examples, and Comparative Examples, but the present invention is not limited thereto. In the following formulae, Me denotes a methyl group. In addition, copolymerization composition ratio means mole ratio, and weight average molecular weight (Mw) means a weight average molecular weight measured by gel permeation chromatography (GPO) in terms of polystyrene.

<Synthesis of Sulfonium Salt>

First, sulfonium salts PM-1 to PM-3 having polymerizable anions were synthesized in the following manner.

Synthesis Example 1

Sulfonium salt (PM-1) was synthesized in the following manner.

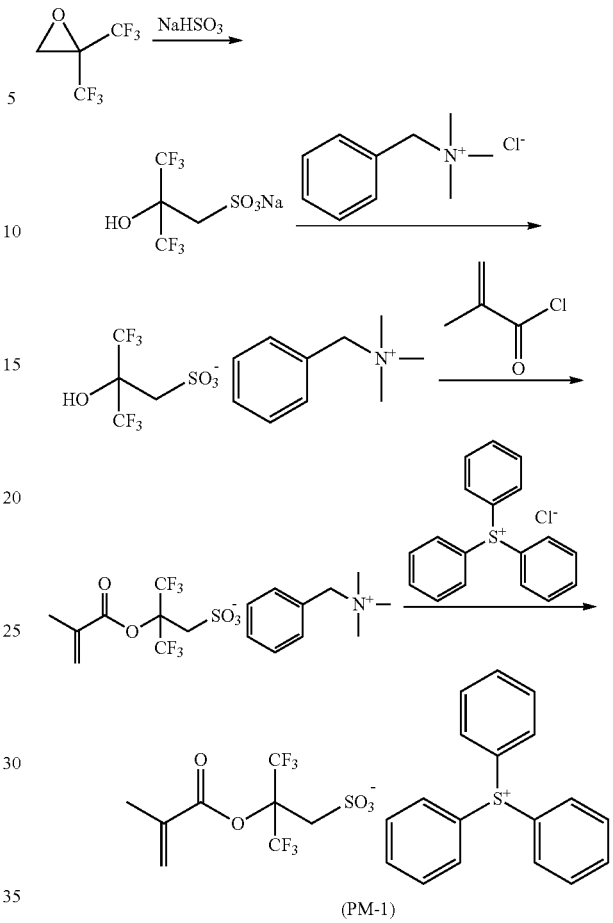

(PM-1)

Sodium 3,3,3-trifluoro-2-hydroxy-2-trifluoromethylpropane-1-sulfonate was synthesized in according with a method described in Japanese Patent Laid-Open Publication No. 2010-215608. To 132 g of an aqueous solution containing the sodium 3,3,3-trifluoro-2-hydroxy-2-trifluoromethylpropane-1-sulfonate (corresponding to 0.1 mol of sodium 3,3,3-trifluoro-2-hydroxy-2-trifluoromethylpropane-1-sulfonate) were added 200 g of methylene chloride and 20.4 g of benzyltrimethylammonium chloride, and the solution was stirred for 30 minutes. The stirred aqueous solution was subjected to liquid separation and extraction, and then washed with water. Then, the organic layer was concentrated, methyl isobutyl ketone was added thereto, and the solution was concentrated again. To the concentrated solution was added diisopropyl ether for recrystallization, and the precipitated solid was collected and dried under reduced pressure to obtain a benzyltrimethylammonium salt. To the obtained benzyltrimethylammonium salt were added 15.0 g of triethylamine and 200 g of methylene chloride. This mixed solution was mixed with 11.5 g of methacryloyl chloride under ice-cooling and stirred at room temperature overnight. Then, 100 g of water was added to the reaction solution to quench the reaction. The quenched reaction solution was subjected to liquid separation, and a triphenylsulfonium chloride aqueous solution was added to the extracted organic layer, followed by stirring for 30 minutes, liquid separation, and washing with water. Then, the organic layer was concentrated, and methyl isobutyl ketone was added thereto, and the solution was concentrated again. To the concentrated solution was added diisopropyl ether for recrystallization, and the precipitated solid was collected and dried under reduced pressure to obtain an intended product, triphenylsulfonium=2-(methacryloyloxy)-3,3,3-trifluoro-2-trifluoromethylpropane-1-sulfonate (PM-1) as a white solid, with a yield of 85%.

Synthesis Example 2

Triphenylsulfonium=2-(1-methacryloyloxyadamantane-3-carbonyloxy)-3,3,3-trifluoro-2-trifluoromethylpropane-1-sulfonate (PM-2) was synthesized as a white solid with a yield of 88% by the same reaction as in Synthesis Example 1 except for using 1-methacryloyloxyadamantane-3-carbonyloxy chloride instead of methacryloyl chloride in Synthesis Example 1.

Synthesis Example 3

10-phenylphenoxathiinium=2-(1-methacryloyloxyadamantane-3-carbonyloxy)-3,3,3-trifluoro-2-trifluoromethylpropane-1-sulfonate (PM-3) was synthesized as a white solid with a yield of 91% by the same reaction as in Synthesis Example 2 except for using an aqueous solution of 10-phenylphenoxathiinium chloride instead of the aqueous solution of triphenylsulfonium chloride in Synthesis Example 2.

Example 1-1

Under a nitrogen atmosphere, a 1000-mL dropping cylinder was charged with 142.2 g of a 50.0 mass % PGMEA solution of 4-hydroxystyrene, 11.3 g of acenaphthylene, 60.2 g of 4-(8-tricyclo[5,2,1,0$^{2,6}$]decanyloxy)styrene, 57.5 g of PM-1 obtained above, 17.9 g of dimethyl-2,2'-azobis-(2-methylpropionate) (Product name: V-601, available from Wako Pure Chemical Industries, Ltd.), and, as a solvent, 100 g of γ-butyrolactone and 130 g of PGMEA to prepare a solution. Furthermore, a 2000-mL flask for polymerization under a nitrogen atmosphere was charged with 160 g of γ-butyrolactone, and the prepared solution was added dropwise thereto over 4 hours under heating at 80° C. After completion of dropwise addition, the solution was stirred for 18 hours while the polymerization temperature was maintained at 80° C., followed by cooling to room temperature. The obtained polymerization solution was added dropwise to 6 kg of diisopropyl ether to agglomerate a copolymer. The solution in which the copolymer was agglomerated was left to stand still to remove diisopropyl ether by decantation, and the polymer was dissolved in 1200 g of acetone. This acetone solution was added dropwise to 6 kg of diisopropyl ether, and the precipitated copolymer was collected by filtration. The collected copolymer was dissolved in 1200 g of acetone again. This acetone solution was added dropwise to 6 kg of diisopropyl ether, and the precipitated copolymer was collected by filtration. Thereafter, the collected copolymer was dried at 40° C. for 40 hours to obtain 170 g of a white polymer. The obtained polymer was measured by $^{13}$C-NMR, $^{1}$H-NMR, and GPC, providing the following analytical results.

Copolymerization composition ratio

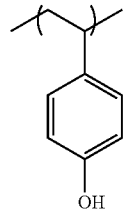

61

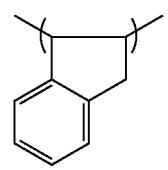

10

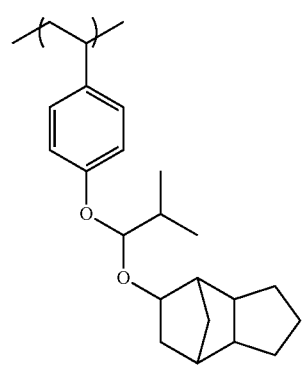

19

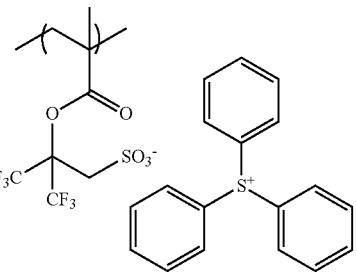

10

Examples 1-2 to 1-33 and Comparative Examples 1-1 to 1-7

Polymers 2 to 33 and Polymers 101 to 107 shown in Table 1 were synthesized in the same manner as in Example 1-1 except for changing the type and the blending ratio of monomers. In Table 1, inducing ratio means mole ratio. Structures of repeating units introduced in the polymers are shown in Tables 2 to 5. Incidentally, repeating units obtained by polymerizing PM-1, PM-2, and PM-3 synthesized in Synthesis Examples 1 to 3 correspond to P-1, P-2, and P-3 in Table 5, respectively. Repeating units (P-4 to P-6) contained in polymer compounds synthesized in Comparative Examples 1-1 to 1-7 function as a photo acid generator.

TABLE 1

| | Polymer | Unit 1 | Introducing ratio (mol %) | Unit 2 | Introducing ratio (mol %) | Unit 3 | Introducing ratio (mol %) | Unit 4 | Introducing ratio (mol %) |
|---|---|---|---|---|---|---|---|---|---|
| Example 1-1 | Polymer 1 | A-1 | 61.0 | B-1 | 10.0 | C-1 | 19.0 | P-1 | 10.0 |
| Example 1-2 | Polymer 2 | A-1 | 57.0 | B-1 | 10.0 | C-2 | 18.0 | P-1 | 15.0 |
| Example 1-3 | Polymer 3 | A-1 | 58.0 | B-1 | 8.0 | C-3 | 24.0 | P-1 | 10.0 |
| Example 1-4 | Polymer 4 | A-1 | 57.0 | B-1 | 10.0 | C-4 | 21.0 | P-1 | 12.0 |
| Example 1-5 | Polymer 5 | A-1 | 62.0 | B-1 | 5.0 | C-5 | 23.0 | P-1 | 10.0 |
| Example 1-6 | Polymer 6 | A-1 | 57.0 | B-1 | 10.0 | C-1 | 18.0 | P-2 | 15.0 |
| Example 1-7 | Polymer 7 | A-1 | 63.0 | B-1 | 8.0 | C-2 | 19.0 | P-2 | 10.0 |
| Example 1-8 | Polymer 8 | A-1 | 50.0 | B-1 | 10.0 | C-3 | 20.0 | P-2 | 20.0 |
| Example 1-9 | Polymer 9 | A-1 | 54.0 | B-1 | 10.0 | C-4 | 21.0 | P-2 | 15.0 |
| Example 1-10 | Polymer 10 | A-1 | 47.0 | B-1 | 10.0 | C-5 | 23.0 | P-2 | 20.0 |
| Example 1-11 | Polymer 11 | A-1 | 52.0 | B-2 | 10.0 | C-1 | 18.0 | P-1 | 20.0 |
| Example 1-12 | Polymer 12 | A-1 | 59.0 | B-2 | 8.0 | C-2 | 18.0 | P-1 | 15.0 |
| Example 1-13 | Polymer 13 | A-1 | 57.0 | B-2 | 10.0 | C-3 | 23.0 | P-1 | 10.0 |
| Example 1-14 | Polymer 14 | A-1 | 54.0 | B-2 | 10.0 | C-4 | 21.0 | P-1 | 15.0 |
| Example 1-15 | Polymer 15 | A-1 | 55.0 | B-2 | 10.0 | C-5 | 20.0 | P-1 | 15.0 |
| Example 1-16 | Polymer 16 | A-1 | 51.0 | B-2 | 10.0 | C-1 | 19.0 | P-2 | 20.0 |
| Example 1-17 | Polymer 17 | A-1 | 52.0 | B-2 | 10.0 | C-2 | 18.0 | P-2 | 20.0 |
| Example 1-18 | Polymer 18 | A-1 | 50.0 | B-2 | 8.0 | C-3 | 22.0 | P-2 | 20.0 |
| Example 1-19 | Polymer 19 | A-1 | 54.0 | B-2 | 10.0 | C-4 | 21.0 | P-2 | 15.0 |
| Example 1-20 | Polymer 20 | A-1 | 51.0 | B-2 | 10.0 | C-5 | 24.0 | P-2 | 15.0 |
| Example 1-21 | Polymer 21 | A-1 | 57.0 | B-2 | 10.0 | C-1 | 18.0 | P-3 | 15.0 |
| Example 1-22 | Polymer 22 | A-1 | 57.0 | B-2 | 5.0 | C-2 | 18.0 | P-3 | 20.0 |
| Example 1-23 | Polymer 23 | A-1 | 50.0 | B-2 | 10.0 | C-3 | 25.0 | P-3 | 15.0 |
| Example 1-24 | Polymer 24 | A-1 | 46.0 | B-2 | 10.0 | C-4 | 24.0 | P-3 | 20.0 |
| Example 1-25 | Polymer 25 | A-1 | 57.0 | B-2 | 10.0 | C-5 | 23.0 | P-3 | 10.0 |
| Example 1-26 | Polymer 26 | A-1 | 60.0 | B-2 | 20.0 | — | — | P-2 | 20.0 |
| Example 1-27 | Polymer 27 | A-1 | 60.0 | B-2 | 20.0 | — | — | P-3 | 20.0 |
| Example 1-28 | Polymer 28 | A-1 | 60.0 | B-1 | 20.0 | — | — | P-3 | 20.0 |
| Example 1-29 | Polymer 29 | A-1 | 58.0 | B-1 | 10.0 | C-6 | 22.0 | P-1 | 10.0 |
| Example 1-30 | Polymer 30 | A-1 | 48.0 | B-1 | 10.0 | C-6 | 22.0 | P-2 | 20.0 |
| Example 1-31 | Polymer 31 | A-1 | 56.0 | B-2 | 10.0 | C-6 | 19.0 | P-1 | 15.0 |
| Example 1-32 | Polymer 32 | A-1 | 57.0 | B-2 | 10.0 | C-6 | 23.0 | P-2 | 10.0 |
| Example 1-33 | Polymer 33 | A-1 | 58.0 | B-2 | 10.0 | C-6 | 22.0 | P-3 | 10.0 |
| Comparative Example 1-1 | Polymer 101 | A-1 | 62.0 | B-2 | 10.0 | C-1 | 18.0 | P-4 | 10.0 |
| Comparative Example 1-2 | Polymer 102 | A-1 | 62.0 | B-2 | 10.0 | C-1 | 18.0 | P-5 | 10.0 |
| Comparative Example 1-3 | Polymer 103 | A-1 | 62.0 | B-2 | 10.0 | C-1 | 18.0 | P-6 | 10.0 |
| Comparative Example 1-4 | Polymer 104 | A-1 | 60.0 | B-2 | 10.0 | C-5 | 20.0 | P-4 | 10.0 |
| Comparative Example 1-5 | Polymer 105 | A-1 | 55.0 | B-2 | 10.0 | C-5 | 20.0 | P-5 | 15.0 |
| Comparative Example 1-6 | Polymer 106 | A-1 | 78.0 | B-2 | 10.0 | C-1 | 12.0 | — | — |
| Comparative Example 1-7 | Polymer 107 | A-1 | 71.0 | B-2 | 10.0 | C-5 | 19.0 | — | — |

TABLE 2
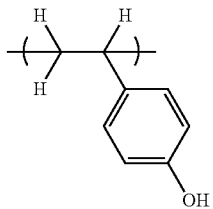
A-1
TABLE 3
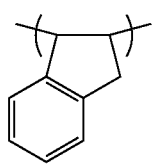
B-1
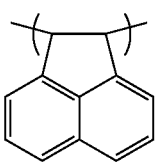
B-2
TABLE 4
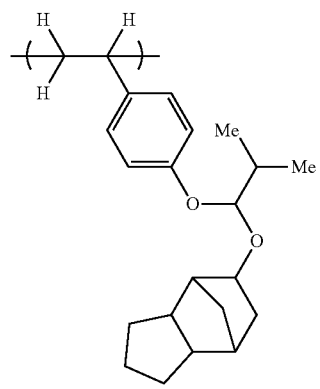
C-1
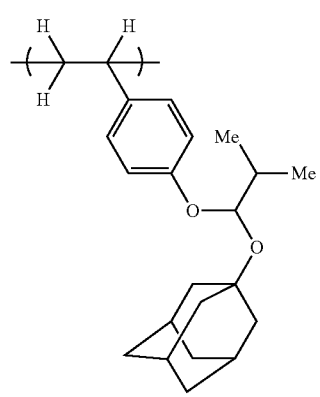
C-2
TABLE 4-continued
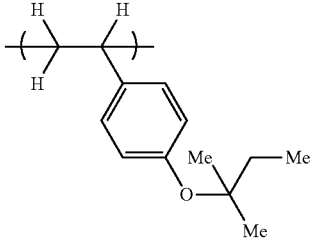
C-3
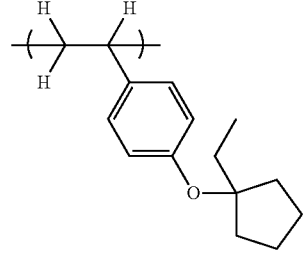
C-4
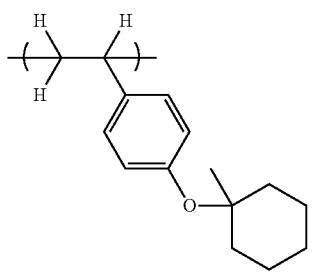
C-5
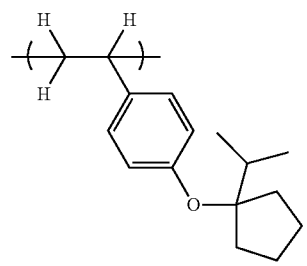
C-6
TABLE 5
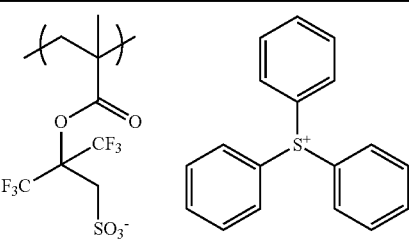
P-1

TABLE 5-continued

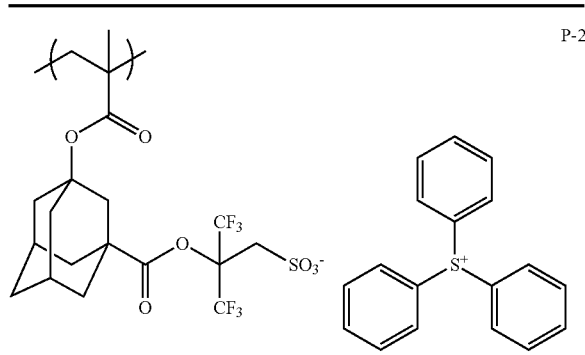

P-2

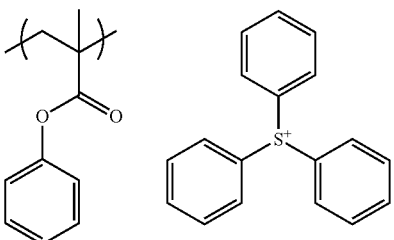

P-6

<Preparation of Positive Resist Composition]

Examples 2-1 to 2-44 and Comparative Examples 2-1 to 2-7

The synthesized polymers, acid generators (PAG-1 to PAG-3) having structures shown in Table 6, basic compounds (Q-1 and Q-2) having structures shown in Table 7, and, in some compositions, an additive of a fluorine-containing polymer FP-1 shown by the following structural formula were dissolved in an organic solvent with the composition shown in Table 8 to prepare resist compositions 1 to 44 and comparative resist compositions 1 to 7. The prepared compositions were each filtered through a 0.2-μm. Teflon (registered trademark) filter to obtain a positive resist composition. To the compositions was added a surfactant, PF-636 (available from Omnova Solutions Inc.) with a concentration of a solid of 0.075 part by mass. Meanwhile in Comparative Example 2-3, the used polymer did not dissolve in the solvent, and thus a resist composition could not be prepared.

The structure of the fluorine-containing polymer (FP-1) is shown below.

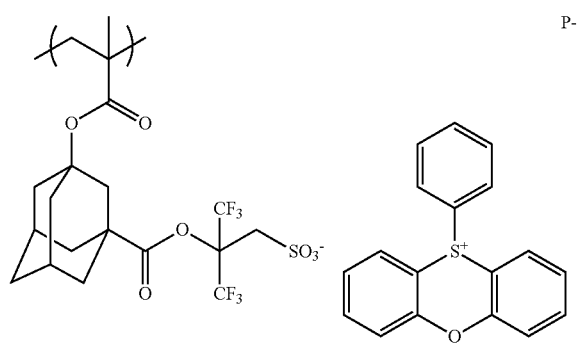

P-3

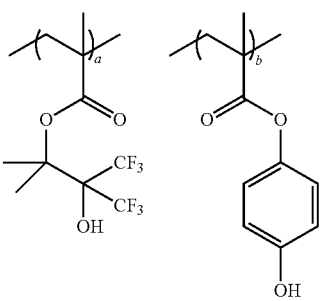

FP-1

(a = 0.80, b = 0.20, Mw = 6,000)

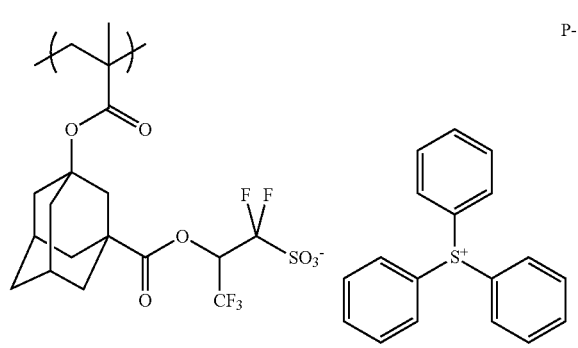

P-4

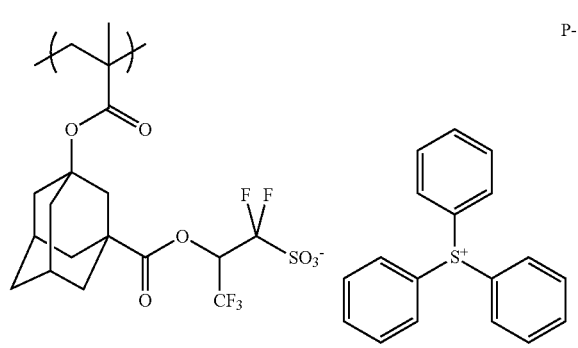

P-5

TABLE 6

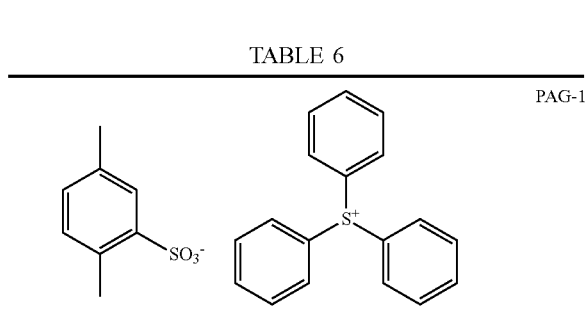

PAG-1

TABLE 6-continued

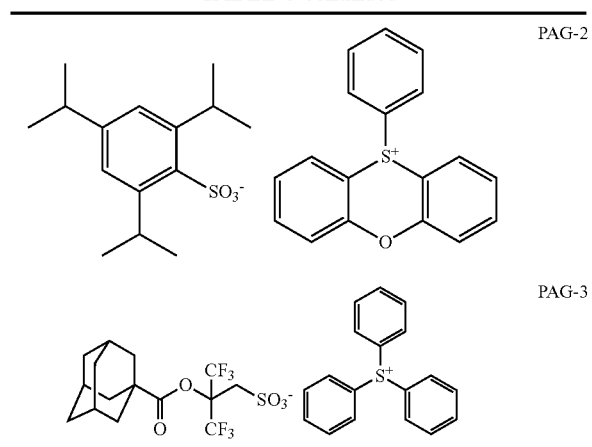

PAG-2

PAG-3

TABLE 7

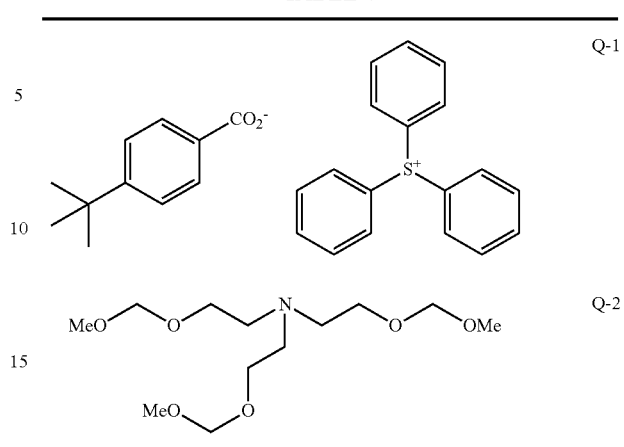

Q-1

Q-2

TABLE 8

| | Polymer (part by mass) | Photo acid generator (part by mass) | Basic compound (part by mass) | Additive (part by mass) | Solvent 1 (part by mass) | Solvent 2 (part by mass) | Solvent 3 (part by mass) |
|---|---|---|---|---|---|---|---|
| | | | [A] | | | | |
| Example 2-1 | Polymer 1 (80) | — | Q-1 (4.0) | — | PGMEA (1080) | EL (1080) | PGME (1440) |
| Example 2-2 | Polymer 6 (80) | — | Q-1 (4.0) | — | PGMEA (1080) | EL (1080) | PGME (1440) |
| Example 2-3 | Polymer 9 (80) | — | Q-1 (4.0) | — | PGMEA (1080) | EL (1080) | PGME (1440) |
| Example 2-4 | Polymer 12 (80) | — | Q-1 (4.0) | — | PGMEA (1080) | EL (1080) | PGME (1440) |
| Example 2-5 | Polymer 14 (80) | — | Q-1 (4.0) | — | PGMEA (1080) | EL (1080) | PGME (1440) |
| Example 2-6 | Polymer 15 (80) | — | Q-1 (4.0) | — | PGMEA (1080) | EL (1080) | PGME (1440) |
| Example 2-7 | Polymer 16 (80) | — | Q-1 (4.0) | — | PGMEA (1080) | EL (1080) | PGME (1440) |
| Example 2-8 | Polymer 18 (80) | — | Q-1 (4.0) | — | PGMEA (1080) | EL (1080) | PGME (1440) |
| Example 2-9 | Polymer 20 (80) | — | Q-1 (4.0) | — | PGMEA (1080) | EL (1080) | PGME (1440) |
| Example 2-10 | Polymer 22 (80) | — | Q-1 (4.0) | — | PGMEA (1080) | EL (1080) | PGME (1440) |
| Example 2-11 | Polymer 23 (80) | — | Q-1 (4.0) | — | PGMEA (1080) | EL (1080) | PGME (1440) |
| Example 2-12 | Polymer 24 (80) | — | Q-1 (4.0) | — | PGMEA (1080) | EL (1080) | PGME (1440) |
| Example 2-13 | Polymer 25 (80) | — | Q-1 (4.0) | — | PGMEA (1080) | EL (1080) | PGME (1440) |
| Example 2-14 | Polymer 29 (80) | — | Q-1 (4.0) | — | PGMEA (1080) | EL (1080) | PGME (1440) |
| Example 2-15 | Polymer 30 (80) | — | Q-1 (4.0) | — | PGMEA (1080) | EL (1080) | PGME (1440) |
| Example 2-16 | Polymer 31 (80) | — | Q-1 (4.0) | — | PGMEA (1080) | EL (1080) | PGME (1440) |
| Example 2-17 | Polymer 32 (80) | — | Q-1 (4.0) | — | PGMEA (1080) | EL (1080) | PGME (1440) |
| Example 2-18 | Polymer 33 (80) | — | Q-1 (4.0) | — | PGMEA (1080) | EL (1080) | PGME (1440) |
| Example 2-19 | Polymer 26 (40) Polymer 106 (40) | — | Q-1 (4.0) | — | PGMEA (1080) | EL (1080) | PGME (1440) |
| Example 2-20 | Polymer 27 (40) Polymer 107 (40) | — | Q-1 (4.0) | — | PGMEA (1080) | EL (1080) | PGME (1440) |
| Example 2-21 | Polymer 26 (40) Polymer 106 (40) | — | Q-1 (5.1) | — | PGMEA (1080) | EL (1080) | PGME (1440) |
| Example 2-22 | Polymer 27 (40) Polymer 107 (40) | — | Q-1 (5.2) | — | PGMEA (1080) | EL (1080) | PGME (1440) |
| Example 2-23 | Polymer 22 (40) Polymer 106 (40) | PAG-1 (5.0) | Q-1 (4.0) | — | PGMEA (1080) | EL (1080) | PGME (1440) |
| Example 2-24 | Polymer 25 (40) Polymer 106 (40) | PAG-1 (5.0) | Q-1 (4.0) | — | PGMEA (1080) | EL (1080) | PGME (1440) |
| Example 2-25 | Polymer 1 (80) | PAG-1 (5.0) | Q-1 (3.9) | — | PGMEA (1080) | EL (1080) | PGME (1440) |
| Example 2-26 | Polymer 16 (80) | PAG-2 (5.0) | Q-1 (4.0) | — | PGMEA (1080) | EL (1080) | PGME (1440) |
| Example 2-27 | Polymer 24 (80) | PAG-3 (5.0) | Q-1 (4.0) | — | PGMEA (1080) | EL (1060) | PGME (1440) |
| Example 2-28 | Polymer 1 (80) | PAG-1 (5.0) | Q-2 (3.8) | — | PGMEA (1080) | EL (1080) | PGME (1440) |
| Example 2-29 | Polymer 16 (80) | PAG-2 (5.0) | Q-2 (3.8) | — | PGMEA (1080) | EL (1080) | PGME (1440) |
| Example 2-30 | Polymer 24 (80) | PAG-3 (5.0) | Q-2 (3.8) | — | PGMEA (1080) | EL (1080) | PGME (1440) |
| Example 2-31 | Polymer 1 (80) | — | Q-1 (4.0) | FP-1 | PGMEA (1080) | EL (1080) | PGME (1440) |
| Example 2-32 | Polymer 1 (80) | PAG-1 (5.0) | Q-1 (4.1) | FP-1 | PGMEA (1080) | EL (1080) | PGME (1440) |
| Example 2-33 | Polymer 25 (80) | — | Q-1 (4.0) | FP-1 | PGMEA (1080) | EL (1080) | PGME (1440) |
| Example 2-34 | Polymer 2 (80) | — | Q-1 (5.0) | — | PGMEA (1060) | EL (1080) | PGME (1440) |
| Example 2-35 | Polymer 3 (80) | — | Q-1 (5.0) | — | PGMEA (1080) | EL (1080) | PGME (1440) |
| Example 2-36 | Polymer 4 (80) | — | Q-1 (5.0) | — | PGMEA (1060) | EL (1080) | PGME (1440) |
| Example 2-37 | Polymer 7 (80) | — | Q-1 (5.0) | — | PGMEA (1080) | EL (1080) | PGME (1440) |
| | | | [B] | | | | |
| Example 2-38 | Polymer 8 (80) | — | Q-1 (5.0) | — | PGMEA (1080) | EL (1080) | PGME (1440) |
| Example 2-39 | Polymer 10 (80) | — | Q-1 (5.0) | — | PGMEA (1080) | EL (1080) | PGME (1440) |
| Example 2-40 | Polymer 13 (80) | — | Q-1 (5.0) | — | PGMEA (1080) | EL (1080) | PGME (1440) |

TABLE 8-continued

|  | Polymer (part by mass) | Photo acid generator (part by mass) | Basic compound (part by mass) | Additive (part by mass) | Solvent 1 (part by mass) | Solvent 2 (part by mass) | Solvent 3 (part by mass) |
|---|---|---|---|---|---|---|---|
| Example 2-41 | Polymer 17 (80) | — | Q-1 (5.0) | — | PGMEA (1080) | EL (1080) | PGME (1440) |
| Example 2-42 | Polymer 19 (80) | — | Q-1 (5.0) | — | PGMEA (1080) | EL (1080) | PGME (1440) |
| Example 2-43 | Polymer 21 (80) | — | Q-1 (5.0) | — | PGMEA (1080) | EL (1080) | PGME (1440) |
| Example 2-44 | Polymer 28 (40) Polymer 106 (40) | — | Q-1 (5.0) | — | PGMEA (1080) | EL (1080) | PGME (1440) |
| Comparative Example 2-1 | Polymer 101 (80) | — | Q-1 (4.0) | — | PGMEA (1080) | EL (1080) | PGME (1440) |
| Comparative Example 2-2 | Polymer 102 (80) | — | Q-1 (4.0) | — | PGMEA (1080) | EL (1080) | PGME (1440) |
| Comparative Example 2-3 | Polymer 103 (80) | — | Q-1 (4.0) | — | PGMEA (1080) | EL (1080) | PGME (1440) |
| Comparative Example 2-4 | Polymer 104 (80) | — | Q-1 (4.0) | — | PGMEA (1080) | EL (1080) | PGME (1440) |
| Comparative Example 2-5 | Polymer 105 (80) | — | Q-1 (4.0) | — | PGMEA (1080) | EL (1080) | PGME (1440) |
| Comparative Example 2-6 | Polymer 106 (80) | PAG-3 (8.0) | Q-1 (5.0) | — | PGMEA (1080) | EL (1080) | PGME (1440) |
| Comparative Example 2-7 | Polymer 107 (80) | PAG-3 (8.0) | Q-1 (5.0) | — | PGMEA (1080) | EL (1080) | PGME (1440) |

PGMEA denotes propylene glycol monomethyl ether acetate. EL denotes ethyl lactate. PGME denotes propylene glycol monomethyl ether.

<Electron Lithography Evaluation>

Examples 3-1 to 3-44 and Comparative Examples 3-1 to 3-7

(I) Resolution Evaluation Using Only Resist Film

The prepared resist compositions (Examples 2-1 to 2-44 and Comparative Examples 2-1, 2-2, 2-4 to 2-7) were each applied onto a 152-mm square photomask blank having a chromium oxynitride film on its outermost surface by spin coating with ACT-M (manufactured by Tokyo Electron, Ltd.), and pre-baked on a hot plate at 110° C. for 600 seconds to form a resist film with a thickness of 80 nm. The thickness of the obtained resist film was measured with an optical measurement apparatus Nanospec (manufactured by Nanometrics, Inc.). The measurement was performed at 81 in-plane positions of the blank substrate except for an outer edge portion within 10 mm from the blank outer circumference to calculate the average film thickness value and the film thickness range.

Then, the resist film was exposed to light with an electron beam exposure apparatus (EBM-5000plus, manufactured by NuFlare Technology, Inc. with an acceleration voltage of 50 key), subjected to PEB at 130° C. for 600 seconds, and developed with a 2.38 mass % tetramethylammonium hydroxide aqueous solution to obtain a positive pattern. The obtained resist pattern was evaluated in the following manner.

The photomask blank on which the pattern has been formed was observed with a top-down SEM (scanning electron microscope). An exposure dose that achieved 1:1 resolution of a 400-nm line and space (LS) was defined as optimum exposure dose ($\mu C/cm^2$). A minimum dimension at the exposure dose that achieves 1:1 resolution of a 400-nm LS was defined as resolution (limiting resolution). LER of a 200-nm LS was measured with SEM. Moreover, the limiting resolution of an isolated line (IL) and an isolated space (IS) were also measured. IL is resolution of one isolated line pattern, and IS is resolution of one isolated space pattern. Table 9 shows evaluation results of the inventive positive resist compositions and the comparative resist composition in electron beam lithography. Incidentally, the optimum exposure dose shown in Table 9 is a value on the basis of LS.

TABLE 9A

|  | Optimum exposure dose (LS) ($\mu C/cm^2$) | Resolution (LS) (nm) | Resolution (IL) (nm) | Resolution (IS) (nm) | LER (nm) |
|---|---|---|---|---|---|
| Example 3-1 | 46 | 40 | 40 | 40 | 4.5 |
| Example 3-2 | 49 | 40 | 40 | 45 | 4.9 |
| Example 3-3 | 50 | 40 | 45 | 40 | 4.9 |
| Example 3-4 | 47 | 40 | 40 | 40 | 4.8 |
| Example 3-5 | 46 | 45 | 40 | 40 | 4.7 |
| Example 3-6 | 47 | 40 | 40 | 45 | 4.6 |
| Example 3-7 | 49 | 40 | 40 | 40 | 4.7 |
| Example 3-8 | 50 | 40 | 45 | 40 | 4.6 |
| Example 3-9 | 50 | 40 | 40 | 45 | 4.7 |
| Example 3-10 | 50 | 40 | 40 | 40 | 4.6 |
| Example 3-11 | 48 | 40 | 40 | 40 | 4.5 |
| Example 3-12 | 49 | 40 | 40 | 40 | 4.6 |
| Example 3-13 | 49 | 40 | 40 | 40 | 4.6 |
| Example 3-14 | 48 | 40 | 40 | 40 | 4.8 |
| Example 3-15 | 50 | 40 | 40 | 40 | 4.6 |
| Example 3-16 | 49 | 40 | 40 | 40 | 4.7 |
| Example 3-17 | 47 | 40 | 40 | 40 | 4.5 |
| Example 3-18 | 48 | 40 | 40 | 40 | 4.8 |
| Example 3-19 | 47 | 40 | 40 | 40 | 4.7 |
| Example 3-20 | 48 | 40 | 45 | 40 | 4.6 |
| Example 3-21 | 49 | 40 | 40 | 40 | 4.7 |
| Example 3-22 | 49 | 40 | 40 | 40 | 4.8 |
| Example 3-23 | 47 | 40 | 40 | 40 | 4.7 |
| Example 3-24 | 48 | 40 | 40 | 40 | 4.7 |
| Example 3-25 | 47 | 40 | 40 | 45 | 5.0 |
| Example 3-26 | 48 | 40 | 45 | 40 | 4.6 |
| Example 3-27 | 48 | 45 | 45 | 40 | 4.8 |
| Example 3-28 | 48 | 40 | 45 | 40 | 5.0 |
| Example 3-29 | 49 | 45 | 40 | 40 | 4.8 |
| Example 3-30 | 47 | 40 | 40 | 45 | 4.9 |
| Example 3-31 | 51 | 40 | 40 | 40 | 4.9 |
| Example 3-32 | 50 | 40 | 45 | 40 | 4.7 |
| Example 3-33 | 50 | 45 | 40 | 40 | 4.9 |
| Example 3-34 | 48 | 45 | 45 | 45 | 4.9 |
| Example 3-35 | 49 | 45 | 40 | 45 | 4.8 |
| Example 3-36 | 50 | 45 | 45 | 40 | 4.7 |
| Example 3-37 | 47 | 45 | 45 | 45 | 4.8 |
| Example 3-38 | 48 | 40 | 40 | 45 | 4.7 |
| Example 3-39 | 48 | 45 | 40 | 40 | 4.7 |
| Example 3-40 | 48 | 45 | 45 | 45 | 4.6 |
| Example 3-41 | 47 | 45 | 40 | 40 | 4.8 |

TABLE 9A-continued

| | Optimum exposure dose (LS) (µC/cm²) | Resolution (LS) (nm) | Resolution (IL) (nm) | Resolution (IS) (nm) | LER (nm) |
|---|---|---|---|---|---|
| Example 3-42 | 46 | 40 | 45 | 45 | 4.7 |
| Example 3-43 | 48 | 45 | 45 | 45 | 4.8 |
| Example 3-44 | 47 | 45 | 40 | 40 | 4.9 |
| Comparative Example 3-1 | 48 | 60 | 60 | 65 | 6.5 |
| Comparative Example 3-2 | 49 | 60 | 60 | 55 | 6.1 |
| Comparative Example 3-4 | 53 | 55 | 60 | 60 | 7.1 |
| Comparative Example 3-5 | 50 | 55 | 55 | 60 | 6.8 |
| Comparative Example 3-6 | 49 | 55 | 55 | 55 | 5.8 |
| Comparative Example 3-7 | 48 | 55 | 55 | 55 | 5.7 |

The result of Table 9 will be now described. All the resist compositions using the polymer containing the repeating unit shown by the formula (1c) (Examples 3-1 to 3-44) had good resolution and good LER. On the other hand, the resist compositions using the polymer containing the repeating unit that generates α,α-difluoroalkanesulfonic acid by exposure (Comparative Examples 3-1, 3-2, 3-4, and 3-5) had low resolution and large LER. This result may be caused by the following: The acid-generating unit in the polymer used in Comparative Examples had too strong acidity for deprotection of an acid-labile group. Thus, a trace of acids that diffused into the unexposed part caused deprotection reaction at the unexposed part, thereby decreasing resolution and increasing LER.

Moreover, resolution was decreased also in the case of using the acid-generating repeating units containing no polymer (Comparative Examples 3-6 and 3-7). This indicates that the polymer combined with the acid-generating unit is superior in resolution.

(II) Electron Beam Exposure Evaluation of Resist Film on which Antistatic Film is Formed Reference Examples 1 to 5

If a high current of 50 A or more, especially 200 A or more is applied to draw on a resist film with an electron beam, an orbit of the electron beam is bent by electrostatic repulsion due to the charged resist film. This can cause a problem of inability to draw a pattern with high position accuracy. To solve this problem, an antistatic film was formed on the resist film before pattern drawing.

The resist film was formed under the same condition as in (I) resolution evaluation using only the resist film. Then, a conductive polymer composition was dropped and applied over the resist film by spin coating with ACT-M (manufactured by Tokyo Electron, Ltd.), and baked on a hot plate at 90° C. for 600 seconds to form an antistatic film with a thickness of 60 nm. The conductive polymer composition used was an aqueous dispersion containing polyaniline doped with polystyrene, described in Proc. SPIE Vol. 8522 852200-1. The photomask blank having this antistatic film on the resist layer was exposed to light with an electron beam exposure apparatus (EBM-5000plus, manufactured by NuFlare Technology, Inc. with acceleration voltage of 50 keV), subjected to PEB at 130° C. for 600 seconds, and developed with a 2.38 mass % tetramethylammonium hydroxide aqueous solution to obtain a positive pattern. The obtained resist pattern was then evaluated in the following manner.

(Optimum Exposure Dose, Limiting Resolution)

These properties were evaluated in the same manner as in (I) resolution evaluation using only the resist film.

(Surface Resistance)

The surface resistance of the obtained antistatic film was measured with Hiresta-UP MCP-HT450 (manufactured by Mitsubishi Chemical corp.).

(Sensitivity Change Rate)

The sensitivities in Reference Examples 1 to 5 were compared with sensitivities in Examples 2-1, 2-13, 2-31 to 2-33 respectively, to calculate deviation (%).

(Pattern Profile)

The pattern area was cut to take a SEM image, and the image was checked visually.

(PCD: Post Coating Delay)

The film was exposed 2 weeks after the antistatic film was formed with the same exposure dose as the exposure dose that achieved the resolution of a 400-nm LS pattern just after the antistatic film was formed to measure a difference in line width. The change amount of the line width per day was defined as PCD.

The results are given in Table 10.

TABLE 10

| | Resist composition | Optimum exposure dose (µC/cm²) | Limiting resolution (nm) | Surface resistance (Ω/□) | Sensitivity change rate | Pattern profile | PCD (nm/day) |
|---|---|---|---|---|---|---|---|
| Reference Example 1 | Example 2-1 | 41 | 50 | $3.1 \times 10^8$ | −10.9% | Tapered | 0.29 |
| Reference Example 2 | Example 2-13 | 43 | 50 | $3.3 \times 10^8$ | −12.2% | Tapered | 0.34 |
| Reference Example 3 | Example 2-31 | 50 | 40 | $3.2 \times 10^8$ | −2.0% | Rectangular | 0.07 |
| Reference Example 4 | Example 2-32 | 49 | 40 | $3.2 \times 10^8$ | −2.0% | Rectangular | 0.07 |
| Reference Example 5 | Example 2-33 | 49 | 40 | $3.3 \times 10^8$ | −2.0% | Rectangular | 0.07 |

In Reference Examples 1 and 2, which used the resist composition not containing a fluorine-containing polymer compound except for the inventive polymer compound, acid components contained in the antistatic film composition penetrated into the resist film. This penetration caused the sensitivity to be considerably changed, the pattern profile to be tapered, and the PCD to be increased. By contrast, in Reference Examples 3 to 5, which used the resist composition containing an additional fluorine-containing polymer compound besides the inventive polymer compound, the sensitivity was less changed, the pattern profile was kept rectangular, and the PCD was good. Regarding the surface resistance, there is no much difference among Reference Examples 1 to 5, and all examples could draw the pattern with high drawing position accuracy. These results demonstrated that use of the resist composition containing an additional fluorine-containing polymer compound besides the inventive polymer compound enables mask pattern formation with high accuracy and high resolution by forming an antistatic film on the resist film formed from the resist composition and directly drawing with a high energy beam.

It should be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A polymer compound comprising a repeating unit shown by the formula (1c) and at least one repeating unit selected from the group consisting of a repeating unit shown by the formula (2) and a repeating unit shown by the formula (3),

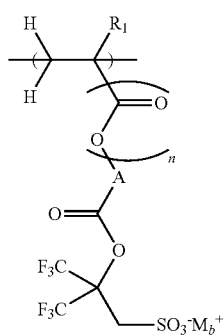

wherein $R^1$ represents a hydrogen atom, a fluorine atom, a methyl group, or a trifluoromethyl group; A represents a single bond or a linear divalent hydrocarbon group having 1 to 30 carbon atoms or a branched or cyclic divalent hydrocarbon group having 3 to 30 carbon atoms, in which the hydrocarbon group may contain a heteroatom, and a part or all of hydrogen atoms in the hydrocarbon group may be substituted with a group containing a heteroatom; "n" represents 0 or 1, provided that "n" is 0 when A is a single bond; and $M_b^+$ represents a sulfonium cation shown by the formula (a) or an iodonium cation shown by the formula (b),

wherein $R^{100}$, $R^{200}$, $R^{300}$, $R^{400}$, and $R^{500}$ independently represent a heteroatom or a linear monovalent hydrocarbon group having 1 to 20 carbon atoms or a branched or cyclic monovalent hydrocarbon group having 3 to 20 carbon atoms, in which the hydrocarbon group may contain a heteroatom, and a part or all of hydrogen atoms in the hydrocarbon group may be substituted with a group containing a heteroatom; and two or more of $R^{100}$, $R^{200}$, and $R^{300}$ may be bonded to each other to form a ring together with the sulfur atom in the formula,

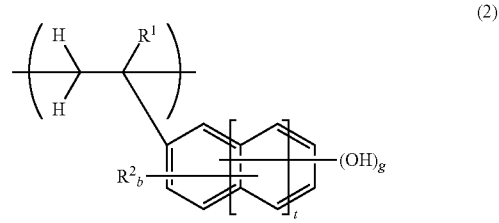

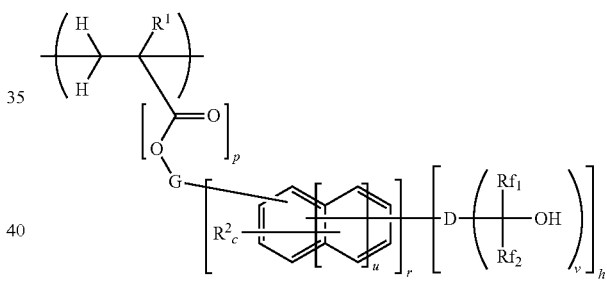

wherein G represents a single bond or an alkylene group having 1 to 10 carbon atoms and optionally containing an ether oxygen atom; D represents a single bond, or a linear aliphatic hydrocarbon group having 1 to 10 carbon atoms or a branched or cyclic aliphatic hydrocarbon group having 3 to 10 carbon atoms with a valency of v+1, in which the aliphatic hydrocarbon group may contain an ether oxygen atom, a carbonyl group, or a carbonyloxy group, and a part or all of hydrogen atoms in the aliphatic hydrocarbon may be substituted with a fluorine atom; $R^1$ is as defined above; $R^2$ represents a hydrogen atom, a halogen atom, a linear acyloxy group having 2 to 8 carbon atoms, a branched or cyclic acyloxy group having 3 to 8 carbon atoms, a linear alkyl group having 1 to 6 carbon atoms, a branched or cyclic alkyl group having 3 to 6 carbon atoms, a linear alkoxy group having 1 to 6 carbon atoms, or a branched or cyclic alkoxy group having 3 to 6 carbon atoms, in which a part or all of hydrogen atoms in the acyloxy group, the alkyl group, and the alkoxy group may be substituted with halogen; $Rf_1$ and $Rf_2$ each represent an alkyl group having 1 to 6 carbon atoms and containing at least one fluorine atom, and $Rf_1$ may bond to D to form a ring together with the carbon atom to which these groups are bonded; "g" represents an integer of 0 to 3; "h" and "v" each represent 1 or 2; "p" and "r" each represent 0 or 1, provided that "p" is 1 and G is a single bond when "r" is 0; "t" and "u" each represent an integer of 0 to 2; "b" represents an integer of (5+2t−g); and "c" represents an integer of (5+2u−h).

2. The polymer compound according to claim 1, further comprising at least one repeating unit selected from the group consisting of a repeating unit shown by the formula (4) and a repeating unit shown by the formula (5),

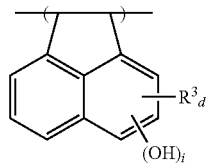

(4)

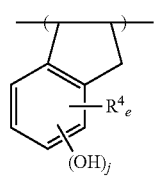

(5)

wherein $R^3$ and $R^4$ each represent a hydrogen atom, a halogen atom, a linear acyloxy group having 2 to 8 carbon atoms, a branched or cyclic acyloxy group having 3 to 8 carbon atoms, a linear alkyl group having 1 to 6 carbon atoms, a branched or cyclic alkyl group having 3 to 6 carbon atoms, a linear alkoxy group having 1 to 6 carbon atoms, or a branched or cyclic alkoxy group having 3 to 6 carbon atoms, in which a part or all of hydrogen atoms in the acyloxy group, the alkyl group, and the alkoxy group may be substituted with halogen; "i" and "j" represent an integer of 0 to 3; "d" represents an integer of 0 to 5; and "e" represents an integer of 0 to 3.

3. The polymer compound according to claim 1, further comprising a repeating unit shown by the formula (U-2),

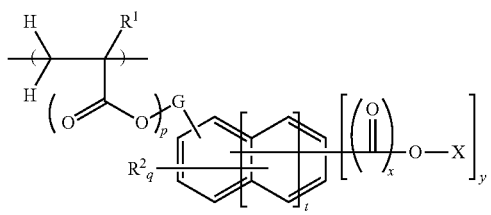

(U-2)

wherein $R^1$, $R^2$, G, "p", and "t" are as defined above; "x" represents 0 or 1; "y" represents an integer of 1 to 3; "q" represents an integer of (5+2t−y); X represents a hydrogen atom or an acid-labile group, provided that at least one X is an acid-labile group.

4. The polymer compound according to claim 2, further comprising a repeating unit shown by the formula (U-2),

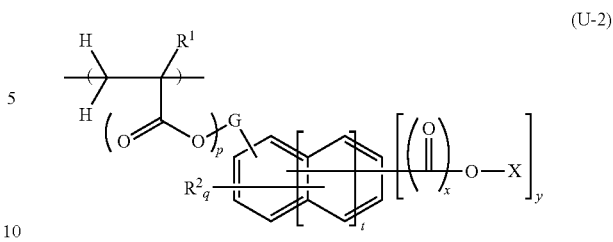

(U-2)

wherein $R^1$, $R^2$, G, "p", and "t" are as defined above; "x" represents 0 or 1; "y" represents an integer of 1 to 3; "q" represents an integer of (5+2t−y); X represents a hydrogen atom or an acid-labile group, provided that at least one X is an acid-labile group.

5. A positive resist composition comprising the polymer compound according to claim 1.

6. A positive resist composition comprising the polymer compound according to claim 2.

7. A positive resist composition comprising the polymer compound according to claim 3.

8. A positive resist composition comprising the polymer compound according claim 4.

9. The positive resist composition according to claim 5, further comprising a compound capable of generating an acid by irradiation with a high energy beam.

10. The positive resist composition according to claim 6, further comprising a compound capable of generating an acid by irradiation with a high energy beam.

11. The positive resist composition according to claim 7, further comprising a compound capable of generating an acid by irradiation with a high energy beam.

12. The positive resist composition according to claim 8, further comprising a compound capable of generating an acid by irradiation with a high energy beam.

13. The positive resist composition according to claim 5, further comprising a polymer compound that contains a repeating units shown by the formula (6) and a repeating unit containing at least one fluorine atom,

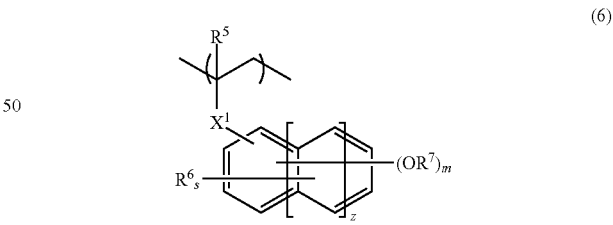

(6)

wherein $R^5$ represents a hydrogen atom or a methyl group; $R^6$ and $R^7$ represent a hydrogen atom or a linear, branched, or cyclic hydrocarbon group having 1 to 5 carbon atoms and optionally containing a heteroatom; $X^1$ represents a single bond, —C(=O)O—, or —C(=O)NH—; "z" represents 0 or 1; "m" represents an integer of 1 to 3; and "s" represents an integer of (5+2z−m).

14. The positive resist composition according to claim 9, further comprising a polymer compound that contains a repeating units shown by the formula (6) and a repeating unit containing at least one fluorine atom,

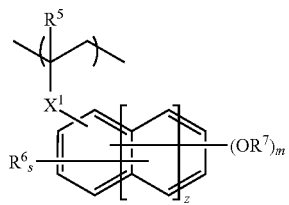 (6)

wherein $R^5$ represents a hydrogen atom or a methyl group; $R^6$ and $R^7$ represent a hydrogen atom or a linear, branched, or cyclic hydrocarbon group having 1 to 5 carbon atoms and optionally containing a heteroatom; $X^1$ represents a single bond, —C(=O)O—, or —C(=O)NH—; "z" represents 0 or 1; "m" represents an integer of 1 to 3; and "s" represents an integer of (5+2z−m).

15. A laminate comprising a resist film formed from the positive resist composition according to claim 5 on a photomask blank.

16. The laminate according to claim 15, further comprising an antistatic film on the resist film.

17. A resist patterning process comprising the step of: forming a resist film on a substrate to be processed from the positive resist composition according to claim 5; exposing the formed resist film to a high energy beam by pattern irradiation; developing the exposed resist film with an alkaline developer to form a resist pattern.

18. The resist patterning process according to claim 17, wherein the high energy beam is an EUV or an electron beam.

19. The resist patterning process according to claim 17, wherein the substrate to be processed is a photomask blank.

20. The resist patterning process according to claim 19, wherein an outermost surface of the photomask blank is formed of a chromium material.

\* \* \* \* \*